(12) United States Patent
Yamakawa et al.

(10) Patent No.: US 7,805,688 B2
(45) Date of Patent: Sep. 28, 2010

(54) MEMORY CONSTRUCTION APPARATUS FOR FORMING LOGICAL MEMORY SPACE

(75) Inventors: Noritoshi Yamakawa, Fukuoka (JP); Hiroaki Miyamoto, Fukuoka (JP); Yoshikatsu Kouhara, Fukuoka (JP); Akitsugu Nakayama, Fukuoka (JP); Kouichi Tanda, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 345 days.

(21) Appl. No.: 11/698,856

(22) Filed: Jan. 29, 2007

(65) Prior Publication Data

US 2007/0180213 A1 Aug. 2, 2007

(30) Foreign Application Priority Data

Feb. 2, 2006 (JP) ............................. 2006-026256

(51) Int. Cl.
*G06F 17/50* (2006.01)
(52) U.S. Cl. .......................................................... 716/1
(58) Field of Classification Search ...................... 716/1, 716/18; 711/101–105, 170
See application file for complete search history.

(56) References Cited

U.S. PATENT DOCUMENTS 7,228,520 B1 * 6/2007 Keller et al. ................... 716/17
2004/0117744 A1 * 6/2004 Nation et al. ................... 716/1
2005/0257184 A1 11/2005 Fujita

OTHER PUBLICATIONS

Patent Abstracts of Japan, Publication No. 09-171527, Published Jun. 30, 1997.

* cited by examiner

*Primary Examiner*—Vuthe Siek
(74) *Attorney, Agent, or Firm*—Staas & Halsey LLP

(57) ABSTRACT

A logical memory construction-processing section reads several kinds of physical memories and registers prepared in advance as libraries, generates candidates for each logical memory, by combining only the physical memories or only the registers, or both the physical memories and the registers, with each other, so as to construct the logical memory that satisfies a logical condition defining a memory space, and selects highest priority candidates for the logical memories from the candidates according to priorities. An optimum construction extraction-processing section extracts optimum logical memories satisfying the respective logical conditions from the highest priority candidates such that the limit numbers of usable physical memories and usable registers are satisfied. A circuit description-processing section executes circuit description by using the physical memories and the registers that construct each of the extracted optimum logical memories, to thereby generate a circuit description file.

18 Claims, 35 Drawing Sheets

T1 LOGICAL CONDITION LIST TABLE

| LOGICAL CONDITION | | |
|---|---|---|
| CONDITION NUMBER | NUMBER OF BITS | NUMBER OF WORDS |
| 1 | 42 | 1025 |
| 2 | 50 | 2100 |
| 3 | 36 | 4100 |

FIG. 3

T2 PHYSICAL RAM LIST TABLE

| PHYSICAL RAM | NUMBER OF BITS | NUMBER OF WORDS |
|---|---|---|
| MACRO 1 | 40 | 512 |
| MACRO 2 | 20 | 1024 |
| MACRO 3 | 10 | 2048 |
| MACRO 4 | 5 | 4096 |

FIG. 4

T3 USABLE PHYSICAL RAM/FF LIMIT NUMBER TABLE

| USABLE PHYSICAL RAM LIMIT NUMBER VALUE | 15 |
|---|---|
| USABLE FF LIMIT NUMBER VALUE (EACH) | 3000 |
| USABLE FF LIMIT NUMBER VALUE (TOTAL) | 10000 |

FIG. 5

T4-1 LOGICAL MEMORY CONSTRUCTION COMBINATION LIST TABLE

| ITEM NUMBER | BIT COMPLEMENT | WORD COMPLEMENT | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|---|
| 1 | ABSENT | ABSENT | MACRO 1 | 40 | 512 | 2 | 3 | 6 | | | |
| 2 | | | MACRO 2 | 20 | 1024 | 3 | 2 | 6 | | | |
| 3 | | | MACRO 3 | 10 | 2048 | 5 | 1 | 5 | | | |
| 4 | | | MACRO 4 | 5 | 4096 | 9 | 1 | 9 | | | |
| 5 | ABSENT | PRESENT | MACRO 1 | 40 | 512 | 2 | 2 | 4 | | 42 BITS X 1 WORD | 42 |
| 6 | | | MACRO 2 | 20 | 1024 | 3 | 1 | 3 | | 42 BITS X 1 WORD | 42 |
| 7 | | | MACRO 3 | 10 | 2048 | 0 | 0 | 0 | | | 0 |
| 8 | | | MACRO 4 | 5 | 4096 | 0 | 0 | 0 | | | 0 |
| 9 | PRESENT | ABSENT | MACRO 1 | 40 | 512 | 1 | 3 | 3 | 2 BITS X 1536 WORDS | | 3072 |
| 10 | | | MACRO 2 | 20 | 1024 | 2 | 2 | 4 | 2 BITS X 2048 WORDS | | 4096 |
| 11 | | | MACRO 3 | 10 | 2048 | 4 | 1 | 4 | 2 BITS X 2048 WORDS | | 4096 |
| 12 | | | MACRO 4 | 5 | 4096 | 8 | 1 | 8 | 2 BITS X 4096 WORDS | | 8192 |
| 13 | PRESENT | PRESENT | MACRO 1 | 40 | 512 | 1 | 2 | 2 | 2 BITS X 1024 WORDS | 42 BITS X 1 WORD | 2090 |
| 14 | | | MACRO 2 | 20 | 1024 | 2 | 1 | 2 | 2 BITS X 1024 WORDS | 42 BITS X 1 WORD | 2090 |
| 15 | | | MACRO 3 | 10 | 2048 | 0 | 0 | 0 | | | 0 |
| 16 | | | MACRO 4 | 5 | 4096 | 0 | 0 | 0 | | | 0 |

FIG. 11A

T4-2 LOGICAL MEMORY CONSTRUCTION COMBINATION LIST TABLE

| ITEM NUMBER | BIT COMPLE- -MENT | WORD COMPLE -MENT | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT- COMPLEMENTING FFS | NUMBER OF WORD- COMPLEMENTING FFS | TOTAL NUMBER OF FFS |
|---|---|---|---|---|---|---|---|---|---|---|---|
| 3 | ABSENT | ABSENT | MACRO 3 | 10 | 2048 | 5 | 1 | 5 | | | |
| 2 | | | MACRO 2 | 20 | 1024 | 3 | 2 | 6 | | | |
| 1 | | | MACRO 1 | 40 | 512 | 2 | 3 | 6 | | | |
| 4 | | | MACRO 4 | 5 | 4096 | 9 | 1 | 9 | | | |
| 6 | ABSENT | PRESENT | MACRO 2 | 20 | 1024 | 3 | 1 | 3 | | 42 BITS X 1 WORD | 42 |
| 5 | | | MACRO 1 | 40 | 512 | 2 | 2 | 4 | | 42 BITS X 1 WORD | 42 |
| 9 | PRESENT | ABSENT | MACRO 1 | 40 | 512 | 1 | 3 | 3 | 2 BITS X 1536 WORDS | | 3072 |
| 10 | | | MACRO 3 | 10 | 2048 | 4 | 1 | 4 | 2 BITS X 2048 WORDS | | 4096 |
| 11 | | | MACRO 2 | 20 | 1024 | 2 | 2 | 4 | 2 BITS X 2048 WORDS | | 4096 |
| 12 | | | MACRO 4 | 5 | 4096 | 8 | 1 | 8 | 2 BITS X 4096 WORDS | | 8192 |
| 14 | PRESENT | PRESENT | MACRO 2 | 20 | 1024 | 2 | 1 | 2 | 2 BITS X 1024 WORDS | 42 BITS X 1 WORD | 2090 |
| 13 | | | MACRO 1 | 40 | 512 | 1 | 2 | 2 | 2 BITS X 1024 WORDS | 42 BITS X 1 WORD | 2090 |

FIG. 11B

T5-1 LOGICAL MEMORY CONSTRUCTION COMBINATION LIST TABLE

| ITEM NUMBER | BIT COMPLE-MENT | WORD COMPLE-MENT | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|---|
| 1 | ABSENT | ABSENT | MACRO 1 | 40 | 512 | 2 | 5 | 10 | | | |
| 2 | | | MACRO 2 | 20 | 1024 | 3 | 3 | 9 | | | |
| 3 | | | MACRO 3 | 10 | 2048 | 5 | 2 | 10 | | | |
| 4 | | | MACRO 4 | 5 | 4096 | 10 | 1 | 10 | | | |
| 5 | ABSENT | PRESENT | MACRO 1 | 40 | 512 | 2 | 4 | 8 | | 50 BITS X 52 WORDS | 2600 |
| 6 | | | MACRO 2 | 20 | 1024 | 3 | 2 | 6 | | 50 BITS X 52 WORDS | 2600 |
| 7 | | | MACRO 3 | 10 | 2048 | 5 | 1 | 5 | | 50 BITS X 52 WORDS | 2600 |
| 8 | | | MACRO 4 | 5 | 4096 | 0 | 0 | 0 | | | 0 |
| 9 | PRESENT | ABSENT | MACRO 1 | 40 | 512 | 1 | 5 | 5 | 10 BITS X 2560 WORDS | | 25600 |
| 10 | | | MACRO 2 | 20 | 1024 | 2 | 3 | 6 | 10 BITS X 3072 WORDS | | 30720 |
| 11 | | | MACRO 3 | 10 | 2048 | 4 | 2 | 8 | 10 BITS X 4096 WORDS | | 40960 |
| 12 | | | MACRO 4 | 5 | 4096 | 0 | 0 | 0 | | | 0 |
| 13 | PRESENT | PRESENT | MACRO 1 | 40 | 512 | 1 | 4 | 4 | 10 BITS X 2048 WORDS | 50 BITS X 52 WORDS | 23080 |
| 14 | | | MACRO 2 | 20 | 1024 | 2 | 2 | 4 | 10 BITS X 2048 WORDS | 50 BITS X 52 WORDS | 23080 |
| 15 | | | MACRO 3 | 10 | 2048 | 4 | 1 | 4 | 10 BITS X 2048 WORDS | 50 BITS X 52 WORDS | 23080 |
| 16 | | | MACRO 4 | 5 | 4096 | 0 | 0 | 0 | | | 0 |

FIG. 12A

T5-2 LOGICAL MEMORY CONSTRUCTION COMBINATION LIST TABLE

| ITEM NUMBER | BIT COMPLE-MENT | WORD COMPLE-MENT | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|---|
| 2 | ABSENT | ABSENT | MACRO 2 | 20 | 1024 | 3 | 3 | 9 | | | |
| 3 | | | MACRO 3 | 10 | 2048 | 5 | 2 | 10 | | | |
| 4 | | | MACRO 4 | 5 | 4096 | 10 | 1 | 10 | | | |
| 1 | | | MACRO 1 | 40 | 512 | 2 | 5 | 10 | | | |
| 7 | ABSENT | PRESENT | MACRO 3 | 10 | 2048 | 5 | 1 | 5 | | 50 BITS X 52 WORDS | 2600 |
| 6 | | | MACRO 2 | 20 | 1024 | 3 | 2 | 6 | | 50 BITS X 52 WORDS | 2600 |
| 5 | | | MACRO 1 | 40 | 512 | 2 | 4 | 8 | | 50 BITS X 52 WORDS | 2600 |
| 9 | PRESENT | ABSENT | MACRO 1 | 40 | 512 | 1 | 5 | 5 | 10 BITS X 2560 WORDS | | 25600 |
| 10 | | | MACRO 2 | 20 | 1024 | 2 | 3 | 6 | 10 BITS X 3072 WORDS | | 30720 |
| 11 | | | MACRO 3 | 10 | 2048 | 4 | 2 | 8 | 10 BITS X 4096 WORDS | | 40960 |
| 15 | PRESENT | PRESENT | MACRO 3 | 10 | 2048 | 4 | 1 | 4 | 10 BITS X 2048 WORDS | 50 BITS X 52 WORDS | 23080 |
| 14 | | | MACRO 2 | 20 | 1024 | 2 | 2 | 4 | 10 BITS X 2048 WORDS | 50 BITS X 52 WORDS | 23080 |
| 13 | | | MACRO 1 | 40 | 512 | 1 | 4 | 4 | 10 BITS X 2048 WORDS | 50 BITS X 52 WORDS | 23080 |

FIG. 12B

T6-1 LOGICAL MEMORY CONSTRUCTION COMBINATION LIST TABLE

| ITEM NUMBER | BIT COMPLE-MENT | WORD COMPLE-MENT | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|---|
| 1 | ABSENT | ABSENT | MACRO 1 | 40 | 512 | 1 | 9 | 9 | | | |
| 2 | | | MACRO 2 | 20 | 1024 | 2 | 5 | 10 | | | |
| 3 | | | MACRO 3 | 10 | 2048 | 4 | 3 | 12 | | | |
| 4 | | | MACRO 4 | 5 | 4096 | 8 | 2 | 16 | | | |
| 5 | ABSENT | PRESENT | MACRO 1 | 40 | 512 | 1 | 8 | 8 | | 36 BITS X 4 WORDS | 144 |
| 6 | | | MACRO 2 | 20 | 1024 | 2 | 4 | 8 | | 36 BITS X 4 WORDS | 144 |
| 7 | | | MACRO 3 | 10 | 2048 | 4 | 2 | 8 | | 36 BITS X 4 WORDS | 144 |
| 8 | | | MACRO 4 | 5 | 4096 | 8 | 1 | 8 | | 36 BITS X 4 WORDS | 144 |
| 9 | PRESENT | ABSENT | MACRO 1 | 40 | 512 | 0 | 0 | 0 | | | 0 |
| 10 | | | MACRO 2 | 20 | 1024 | 1 | 5 | 5 | 16 BITS X 5120 WORDS | | 81920 |
| 11 | | | MACRO 3 | 10 | 2048 | 3 | 3 | 9 | 6 BITS X 6144 WORDS | | 36864 |
| 12 | | | MACRO 4 | 5 | 4096 | 7 | 2 | 14 | 1 BIT X 8192 WORDS | | 8192 |
| 13 | PRESENT | PRESENT | MACRO 1 | 40 | 512 | 0 | 0 | 0 | | | 0 |
| 14 | | | MACRO 2 | 20 | 1024 | 1 | 4 | 4 | 16 BITS X 4096 WORDS | 36 BITS X 4 WORDS | 65680 |
| 15 | | | MACRO 3 | 10 | 2048 | 3 | 2 | 6 | 6 BITS X 4096 WORDS | 36 BITS X 4 WORDS | 24720 |
| 16 | | | MACRO 4 | 5 | 4096 | 7 | 1 | 7 | 1 BIT X 8192 WORDS | 36 BITS X 4 WORDS | 8336 |

FIG. 13A

T6-2 LOGICAL MEMORY CONSTRUCTION COMBINATION LIST TABLE

| ITEM NUMBER | BIT COMPLE-MENT | WORD COMPLE-MENT | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|---|
| 1 | ABSENT | ABSENT | MACRO 1 | 40 | 512 | 1 | 9 | 9 | | | |
| 2 | | | MACRO 2 | 20 | 1024 | 2 | 5 | 10 | | | |
| 3 | | | MACRO 3 | 10 | 2048 | 4 | 3 | 12 | | | |
| 4 | | | MACRO 4 | 4 | 4096 | 9 | 2 | 18 | | | |
| 7 | ABSENT | PRESENT | MACRO 3 | 10 | 2048 | 4 | 2 | 8 | | 36 BITS X 4 WORDS | 144 |
| 6 | | | MACRO 2 | 20 | 1024 | 2 | 4 | 8 | | 36 BITS X 4 WORDS | 144 |
| 5 | | | MACRO 1 | 40 | 512 | 1 | 8 | 8 | | 36 BITS X 4 WORDS | 144 |
| 8 | | | MACRO 4 | 4 | 4096 | 9 | 1 | 9 | | 36 BITS X 4 WORDS | 144 |
| 10 | PRESENT | ABSENT | MACRO 2 | 20 | 1024 | 1 | 5 | 5 | 16 BITS X 5120 WORDS | | 81920 |
| 11 | | | MACRO 3 | 10 | 2048 | 3 | 3 | 9 | 6 BITS X 6144 WORDS | | 36864 |
| 12 | | | MACRO 4 | 5 | 4096 | 7 | 2 | 14 | 1 BIT X 8192 WORDS | | 8192 |
| 14 | PRESENT | PRESENT | MACRO 2 | 20 | 1024 | 1 | 4 | 4 | 16 BITS X 4096 WORDS | 36 BITS X 4 WORDS | 65680 |
| 15 | | | MACRO 3 | 10 | 2048 | 3 | 2 | 6 | 6 BITS X 4096 WORDS | 36 BITS X 4 WORDS | 24720 |
| 16 | | | MACRO 4 | 5 | 4096 | 7 | 1 | 7 | 1 BIT X 8192 WORDS | 36 BITS X 4 WORDS | 8336 |

FIG. 13B

T7a LOGICAL MEMORY CONSTRUCTION LIST TABLE

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| | 1 | MACRO 3 | 10 | 2048 | 5 | 1 | 5 | | | 0 |
| | 2 | MACRO 2 | 20 | 1024 | 3 | 3 | 9 | | | 0 |
| | 3 | MACRO 1 | 40 | 512 | 1 | 9 | 9 | | | 0 |

T7b  CANDIDATE LOGICAL MEMORY LIST TABLE

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| 1 | 1 | MACRO 2 | 20 | 1024 | 3 | 1 | 3 | | 42 BITS X 1 WORD | 42 |
| 2 | 1 | MACRO 1 | 40 | 512 | 1 | 3 | 3 | 2 BITS X 1536 WORDS | | 3072 |
| 3 | 1 | MACRO 2 | 20 | 1024 | 2 | 1 | 2 | 2 BITS X 1024 WORDS | 42 BITS X 1 WORD | 2090 |
| 4 | 1 | | | | 0 | 0 | 0 | | | 43050 |
| 5 | 2 | MACRO 3 | 10 | 2048 | 5 | 1 | 5 | | 50 BITS X 52 WORDS | 2600 |
| 6 | 2 | MACRO 1 | 40 | 512 | 1 | 5 | 5 | 10 BITS X 2560 WORDS | | 25600 |
| 7 | 2 | MACRO 3 | 10 | 2048 | 4 | 1 | 4 | 10 BITS X 2048 WORDS | 50 BITS X 52 WORDS | 23080 |
| 8 | 2 | | | | 0 | 0 | 0 | | 50 BITS X 2100 WORDS | 105000 |
| 9 | 3 | MACRO 3 | 10 | 2048 | 4 | 2 | 8 | | 36 BITS X 4 WORDS | 144 |
| 10 | 3 | MACRO 2 | 20 | 1024 | 1 | 5 | 5 | 16 BITS X 5120 WORDS | | 81920 |
| 11 | 3 | MACRO 2 | 20 | 1024 | 1 | 4 | 4 | 16 BITS X 4096 WORDS | 36 BITS X 4 WORDS | 65680 |
| 12 | 3 | | | | 0 | 0 | 0 | | 36 BITS X 4100 WORDS | 147600 |

FIG. 16

T7b-1 CANDIDATE LOGICAL MEMORY LIST TABLE

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| 1 | 1 | MACRO 2 | 20 | 1024 | 3 | 1 | 3 | | 42 BITS X 1 WORD | 42 |
| 9 | 3 | MACRO 3 | 10 | 2048 | 4 | 2 | 8 | | 36 BITS X 4 WORDS | 144 |
| 3 | 1 | MACRO 2 | 20 | 1024 | 2 | 1 | 2 | 2 BITS X 1024 WORDS | 42 BITS X 1 WORD | 2090 |
| 5 | 2 | MACRO 3 | 10 | 2048 | 5 | 1 | 5 | | 50 BITS X 52 WORDS | 2600 |
| 2 | 1 | MACRO 1 | 40 | 512 | 1 | 3 | 3 | 2 BITS X 1536 WORDS | | 3072 |
| 7 | 2 | MACRO 3 | 10 | 2048 | 4 | 1 | 4 | 10 BITS X 2048 WORDS | 50 BITS X 52 WORDS | 23080 |
| 6 | 2 | MACRO 1 | 40 | 512 | 1 | 5 | 5 | 10 BITS X 2560 WORDS | | 25600 |
| 4 | 1 | | | | 0 | 0 | 0 | | 42 BITS X 1025 WORDS | 43050 |
| 11 | 3 | MACRO 2 | 20 | 1024 | 1 | 4 | 4 | 16 BITS X 4096 WORDS | 36 BITS X 4 WORDS | 65680 |
| 10 | 3 | MACRO 2 | 20 | 1024 | 1 | 5 | 5 | 16 BITS X 5120 WORDS | | 81920 |
| 8 | 2 | | | | 0 | 0 | 0 | | 50 BITS X 2100 WORDS | 105000 |
| 12 | 3 | | | | 0 | 0 | 0 | | 36 BITS X 4100 WORDS | 147600 |

T8 OPTIMUM LOGICAL MEMORY CONSTRUCTION COMBINATION LIST TABLE

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| | 1 | MACRO 2 | 20 | 1024 | 2 | 1 | 2 | 2 BITS X 1024 WORDS | 42 BITS X 1 WORD | 2090 |
| | 2 | MACRO 3 | 10 | 2048 | 5 | 1 | 5 | | 50 BITS X 52 WORDS | 2600 |
| | 3 | MACRO 3 | 10 | 2048 | 4 | 2 | 8 | | 36 BITS X 4 WORDS | 144 |

FIG. 18

T7a LOGICAL MEMORY CONSTRUCTION LIST TABLE

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| | 1 | MACRO 3 | 10 | 2048 | 5 | 1 | 5 | | | 0 |
| | 2 | MACRO 2 | 20 | 1024 | 3 | 3 | 9 | | | 0 |
| | 3 | MACRO 1 | 40 | 512 | 1 | 9 | 9 | | | 0 |

(FIRST PROCESS)

⇨

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| | 1 | MACRO 2 | 20 | 1024 | 3 | 1 | 3 | | 42 BITS × 1 WORD | 42 |
| | 2 | MACRO 2 | 20 | 1024 | 3 | 3 | 9 | | | |
| | 3 | MACRO 1 | 40 | 512 | 1 | 9 | 9 | | | |

⇨ 

(SECOND PROCESS)

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| | 1 | MACRO 2 | 20 | 1024 | 3 | 1 | 3 | | 42 BITS X 1 WORD | 42 |
| | 2 | MACRO 2 | 20 | 1024 | 3 | 3 | 9 | | | 0 |
| | 3 | MACRO 1 | 40 | 512 | 1 | 9 | 9 | | | 0 |

① ⇒

(THIRD PROCESS)

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| | 1 | MACRO 2 | 20 | 1024 | 3 | 1 | 3 | | 42 BITS X 1 WORD | 42 |
| | 2 | MACRO 2 | 20 | 1024 | 3 | 3 | 9 | | | 0 |
| | 3 | MACRO 3 | 10 | 2048 | 4 | 2 | 8 | | 36 BITS X 4 WORDS | 144 |

⇒ ②

(FOURTH PROCESS)

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| | 1 | MACRO 2 | 20 | 1024 | 2 | 1 | 2 | 2 BIT X 1024 WORDS | 42 BITS X 1 WORD | 2090 |
| | 2 | MACRO 2 | 20 | 1024 | 3 | 3 | 9 | | | 0 |
| | 3 | MACRO 3 | 10 | 2048 | 4 | 2 | 8 | | 36 BITS X 4 WORDS | 144 |

② ⇒

(FIFTH PROCESS)

T8 OPTIMUM LOGICAL MEMORY CONSTRUCTION COMBINATION LIST TABLE

| ITEM NUMBER | LOGICAL CONDITION NUMBER | PHYSICAL RAM | NUMBER OF BITS | NUMBER OF WORDS | NUMBER OF PHYSICAL RAMS IN BIT DIRECTION | NUMBER OF PHYSICAL RAMS IN WORD DIRECTION | TOTAL NUMBER OF PHYSICAL RAMS | NUMBER OF BIT-COMPLEMENTING FFS | NUMBER OF WORD-COMPLEMENTING FFS | TOTAL NUMBER OF FFS |
|---|---|---|---|---|---|---|---|---|---|---|
| | 1 | MACRO 2 | 20 | 1024 | 2 | 1 | 2 | 2 BIT X 1024 WORDS | 42 BITS X 1 WORD | 2090 |
| | 2 | MACRO 3 | 10 | 2048 | 5 | 1 | 5 | | 50 BITS X 52 WORDS | 2600 |
| | 3 | MACRO 3 | 10 | 2048 | 4 | 2 | 8 | | 36 BITS X 4 WORDS | 144 |

FIG. 21

VARIABLES

| | | |
|---|---|---|
| g_RealAddress | ⇒ | ADDRESS LENGTH OF LOGICAL MEMORY SPACE (WORD) |
| g_RealAddressBitParam | ⇒ | ADDRESS BIT NUMBER OF LOGICAL MEMORY SPACE |
| g_RealDataBitParam | ⇒ | DATA BIT NUMBER OF LOGICAL MEMORY SPACE |
| g_FF_WordParam | ⇒ | NUMBER OF WORDS OF WORD-COMPLEMENTING FF RAM |
| g_RAM_AddressBitParam | ⇒ | ADDRESS BIT NUMBER OF PHYSICAL RAM AND BIT-COMPLEMENTING FF RAM |
| g_FF_AddressBitParam | ⇒ | ADDRESS BIT NUMBER OF WORD-COMPLEMENTING FF RAM |
| g_Gen_RAM_LV3 | ⇒ | NUMBER OF PHYSICAL RAMS IN WORD DIRECTION |
| g_Gen_FFRAM_LV3 | ⇒ | SETTING CONCERNING WHETHER TO USE WORD-COMPLEMENTING FF RAM |
| g_AddressSel | ⇒ | NUMBER OF BITS OF ADDRESS DECODE CIRCUIT |
| g_RAM_DataBitParam | ⇒ | NUMBER OF BITS OF PHYSICAL RAM |
| g_FF_DataBitParam | ⇒ | NUMBER OF BITS OF BIT-COMPLEMENTING FF RAM |
| g_Gen_RAM_LV4 | ⇒ | NUMBER OF PHYSICAL RAMS IN BIT DIRECTION |
| g_Gen_FFRAM_LV4 | ⇒ | SETTING CONCERNING WHETHER TO USE BIT-COMPLEMENTING FF RAM |
| g_AddressClip | ⇒ | BIT NUMBER OF Address_Clip OF PHYSICAL RAM (NUMBER OF BITS IN MSB TO BE CLIPPED TO 0) |
| g_DataClip | ⇒ | BIT NUMBER OF Data_clip OF PHYSICAL RAM (NUMBER OF BITS IN MSB TO BE CLIPPED TO 1 OR 0) |

FIG. 24

```
# VARIABLES
g_RealAddress              ⇒ 1025(Word)
g_RealAddressBitParam      ⇒ 11(Bit)
g_RealDataBitParam         ⇒ 42(Bit)
g_FF_WordParam             ⇒ 1(Word)
g_RAM_AddressBitParam      ⇒ 10(Bit)
g_FF_AddressBitParam       ⇒ 1(Bit)
g_Gen_RAM_LV3              ⇒ 1
g_Gen_FFRAM_LV3            ⇒ 1
g_AddressSel               ⇒ 1(Bit)
g_RAM_DataBitParam         ⇒ 20(Bit)
g_FF_DataBitParam          ⇒ 2(Bit)
g_Gen_RAM_LV4              ⇒ 2
g_Gen_FFRAM_LV4            ⇒ 1 g_AddressClip              ⇒ 0(Bit)
g_DataClip                 ⇒ 0(Bit)
```

FIG. 25

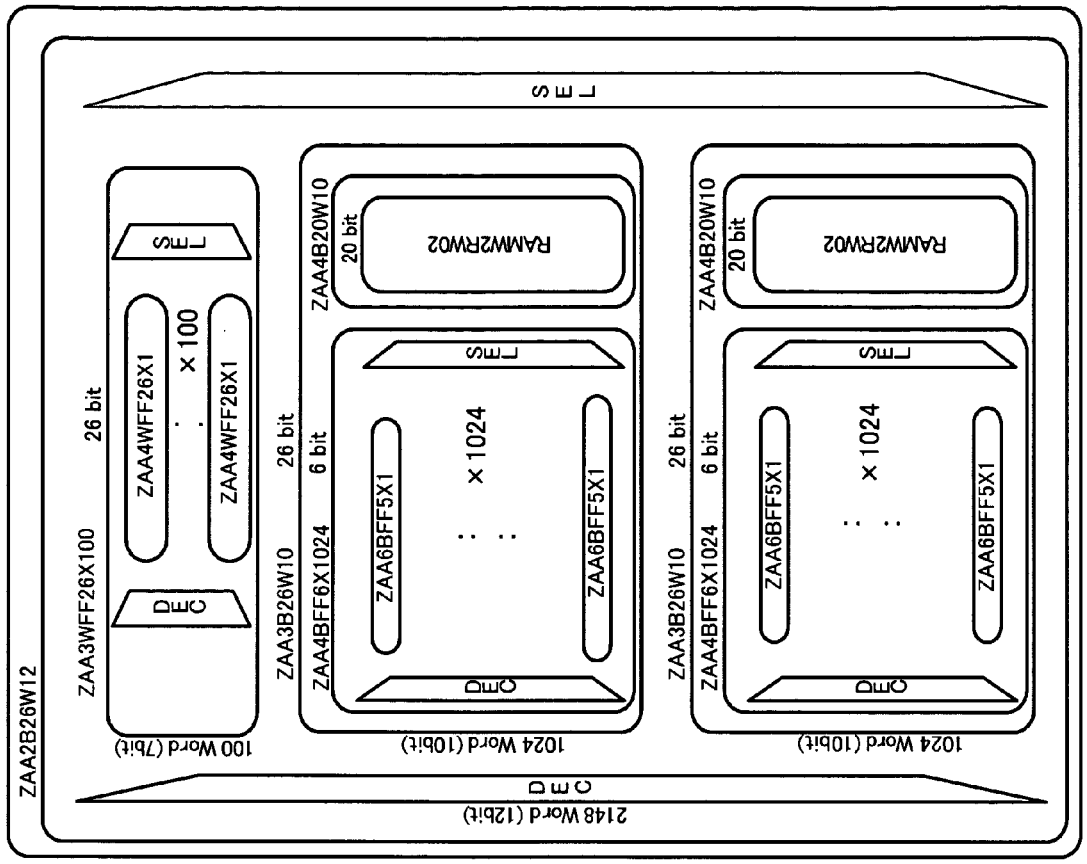
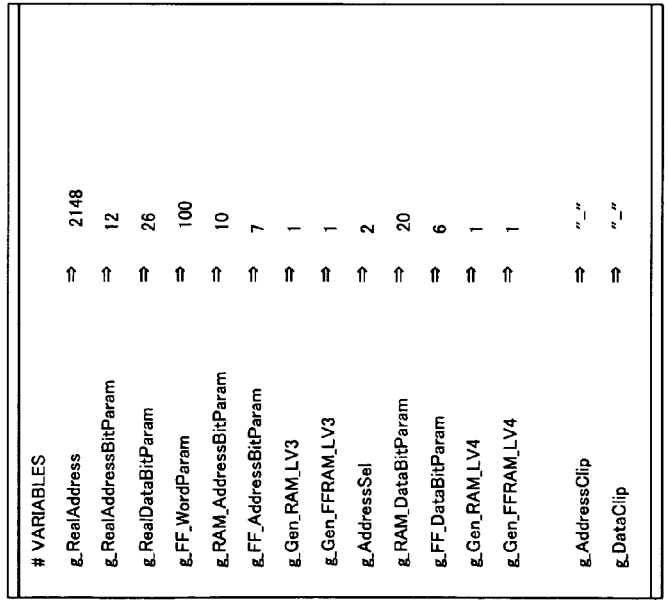
FIG. 29

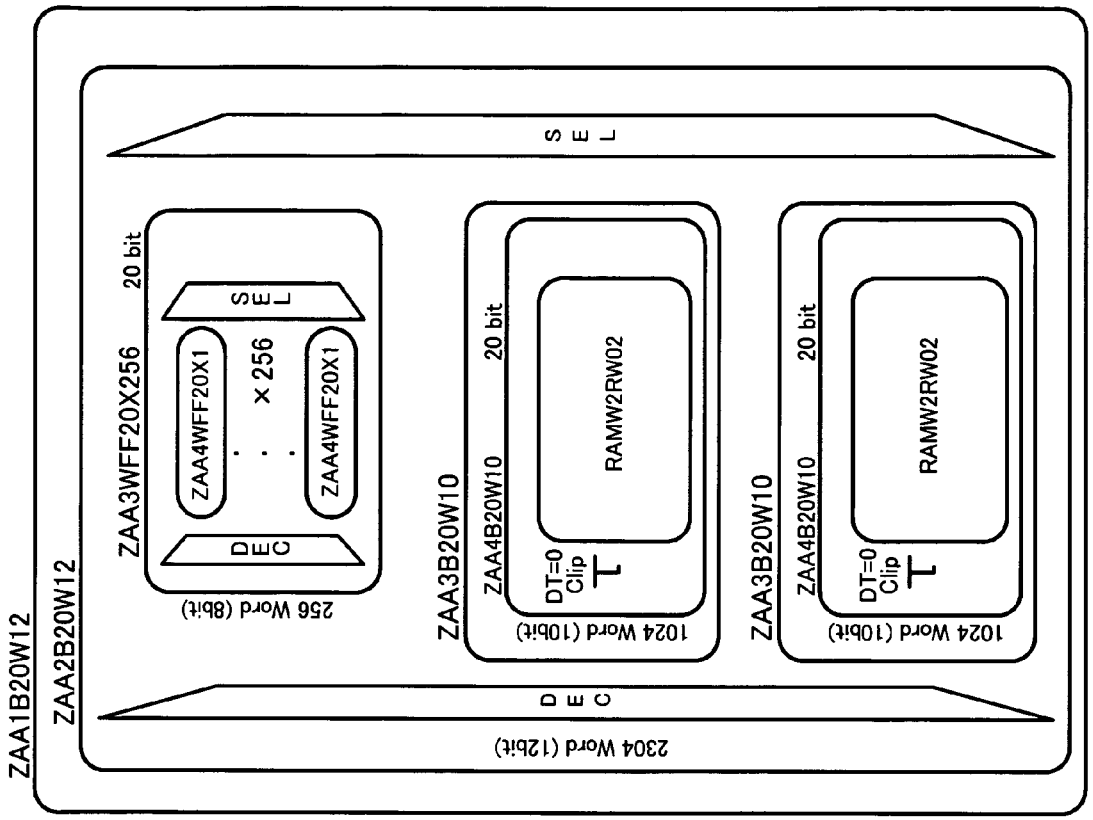
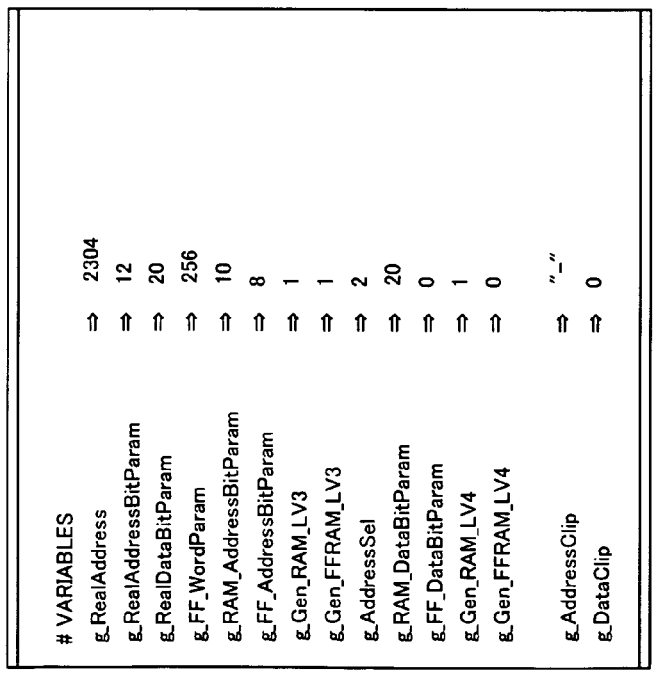
FIG. 30

MEMORY CONSTRUCTION APPARATUS FOR FORMING LOGICAL MEMORY SPACE

CROSS-REFERENCE TO RELATED APPLICATIONS

This application is based upon and claims the benefits of priority from the prior Japanese Patent Application No. 2006-026256 filed on Feb. 2, 2006, the entire contents of which are incorporated herein by reference.

BACKGROUND OF THE INVENTION

1. Field of the Invention

This invention relates to a memory construction apparatus, and more particularly to a memory construction apparatus for constructing logical memories in designing an integrated circuit.

2. Description of the Related Art

ASIC (Application Specific Integrated Art) is the generic name for custom ICs (Integrated Circuits) designed e.g. for specific purpose control, and differently from a general-purpose chip, it is a new dedicated chip designed in accordance with specifications desired by an equipment manufacture.

When an equipment manufacturer develops a product, they generally design the product using a general-purpose chip already available, but when an IC specialized for a specific function is desired, they employ a so-called custom ASIC.

Since the ASIC is specialized for a specific function, it is possible to manufacture a product that consumes less power than when a circuit is constructed using a general-purpose IC. Further, reduction of a mounting area and enhancement of operating speed can be expected.

When an ASIC having a memory function is developed, normally, memory macros, such as several kinds of physical RAMs (Random Access Memories) and FFs (Flip Flops), prepared in advance as libraries, are used (the term "macro" is intended to mean a circuit block having a specific function), and a circuit is described and generated according to a logically required memory space (logical memory space) using an HDL (Hardware Description Language: logical description language for designing an integrated circuit).

Conventionally, a technique for developing an ASIC has been proposed which uses a memory compiler and produces a memory (physical RAM) from memory specifications input to the memory compiler (see e.g. Japanese Laid-Open Patent Publication (Kokai) No. H9-171527 (Paragraph numbers [0006] to [0010], and FIG. 1).

However, there is an upper limit to the capacity of the memory which can be produced with the memory compiler by the conventional ASIC-developing technique, and therefore when the capacity of a logically required memory exceeds the upper limit, it is necessary to produce a circuit of a logical memory by combining several physical RAMs produced by the memory compiler and perform circuit debugging (using logic simulation), which causes an increase in TAT (Turn Around Time: a time period taken to perform a sequence of processes).

Further, it is difficult to predict how many physical RAMs are required at the beginning of design, and hence it is difficult to select from devices, such as an FPGA (Field Programmable Gate Array), a PLD (Programmable Logic Device), and a Structured ASIC, which are limited in the numbers of usable physical RAMs and usable FFs. Even if a device is selected based on a prediction of the number of physical RAMs to be used, a larger number of physical RAMs than predicted sometimes come to be used depending on the combination of RAMs. This can eventually cause the number of physical RAMs to exceed the limited number of usable RAMs, which compels a change in the combination of RAMs (change in the circuit), and further in the worst case, a change in the device.

SUMMARY OF THE INVENTION

The present invention has been made in view of these problems, and an object thereof is to provide a memory construction apparatus for automatically forming a desired logical memory space, thereby making it possible to design an integrated circuit efficiently.

To attain the above object, the present invention provides a memory construction apparatus that constructs logical memories in designing an integrated circuit. The memory construction apparatus is characterized by comprising a logical memory construction-processing section that reads several kinds of physical memories and registers prepared in advance as libraries, generates candidates for each logical memory, by combining only the physical memories or only the registers, or both the physical memories and the registers, with each other so as to construct the logical memory that satisfies a logical condition defining a memory space, and selects highest priority candidates for the logical memories from the candidates according to priorities, an optimum construction extraction-processing section that extracts optimum logical memories satisfying the respective logical conditions from the highest priority candidates such that a limit number of usable physical memories and a limit number of usable registers are satisfied, and a circuit description-processing section that executes circuit description by using the physical memories and the registers that construct each of the extracted optimum logical memories, to thereby generate a circuit description file.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 3 is a diagram showing a logical condition list table;

FIG. 4 is a diagram showing a physical RAM list table;

FIG. 5 is a diagram showing a usable physical RAM/FF limit number table;

FIGS. 11A and 11B are diagrams showing logical memory construction combination list tables;

FIGS. 12A and 12B are diagrams showing logical memory construction combination list tables;

FIGS. 13A and 13B are diagrams showing logical memory construction combination list tables;

FIG. 14 is a diagram showing a logical memory construction list table;

FIG. 15 is a diagram showing a candidate logical memory list table;

FIG. 16 is a diagram showing a candidate logical memory list table;

FIG. 18 is a diagram showing an optimum logical memory construction combination list table;

FIG. 19 is a diagram showing a step in a sequence of changes in the circuit configuration information in the logical memory construction list table;

FIG. 20 is a diagram showing a step in the sequence of changes in the circuit configuration information in the logical memory construction list table;

FIG. 21 is a diagram showing a step in the sequence of changes in the circuit configuration information in the logical memory construction list table;

FIG. 24 is a diagram showing examples of parameters;

FIG. 25 is a diagram showing examples of values of the FIG. 24 parameters;

FIG. 29 is a diagram showing an example of the arrangement of a logical memory comprised of physical RAMs, bit-complementing FFs, and word-complementing FFs;

FIG. 30 is a diagram showing an example of the arrangement of a logical memory comprised of physical RAMs, and word-complementing FFs;

DESCRIPTION OF THE PREFERRED EMBODIMENTS

Figure 1:
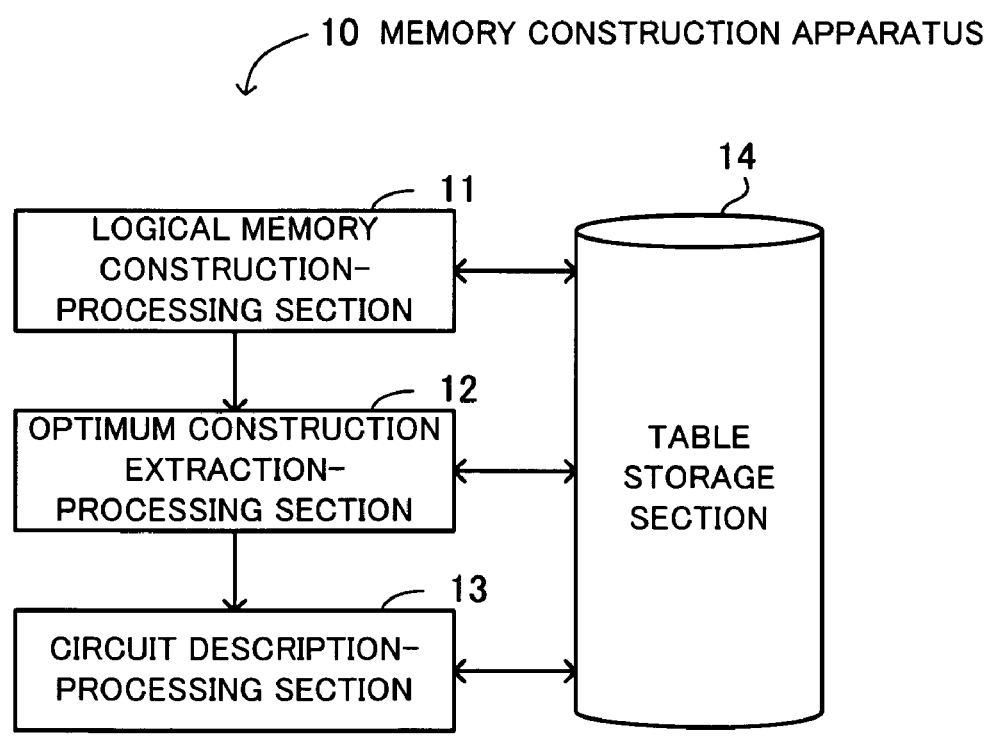
FIG. 1 is a diagram useful in explaining the principles of a memory construction apparatus.

The invention will now be described in detail with reference to drawings showing a preferred embodiment thereof. FIG. 1 is a diagram useful in explaining the principles of a memory construction apparatus. The memory construction apparatus 10 is hardware in which software for automating and assisting operations for designing electronic equipment, semiconductor devices, and so forth, using EDA (Electronic Design Automation) tools is incorporated, and automatically constructs a logical memory during design of an integrated circuit.

It should be noted that in the following descriptions, a physical memory is called a physical RAM, and a register an FF (Flip-Flop). Physical RAMs and FFs are memory macros already registered in libraries. Further, the term "logical memory" is intended to mean a memory formed using physical RAMs and FFs, which is constructed by the automatic memory-constructing function of the memory construction apparatus 10 according to the present invention.

A logical memory construction-processing section 11 reads several kinds of physical RAMs prepared in advance as libraries, and generates candidates for logical memories by combining only physical RAMs or only registers, or both physical memories and registers, with each other so as to construct logical memories respectively satisfying logical conditions each defining a memory space, and selects highest priority candidates for the logical memories from the candidates according to priorities.

An optimum construction extraction-processing section 12 extracts optimum logical memories respectively satisfying the logical conditions from the highest priority candidates such that the respective limits of the numbers of usable physical RAMs and FFs are satisfied. A circuit description-processing section 13 performs circuit description using the physical RAMs and FFs (if used) constructing each extracted optimum logical memory, to thereby generate a circuit description file. A table storage section 14 stores various kinds of table information required for constructing logical memories.

Figure 2:
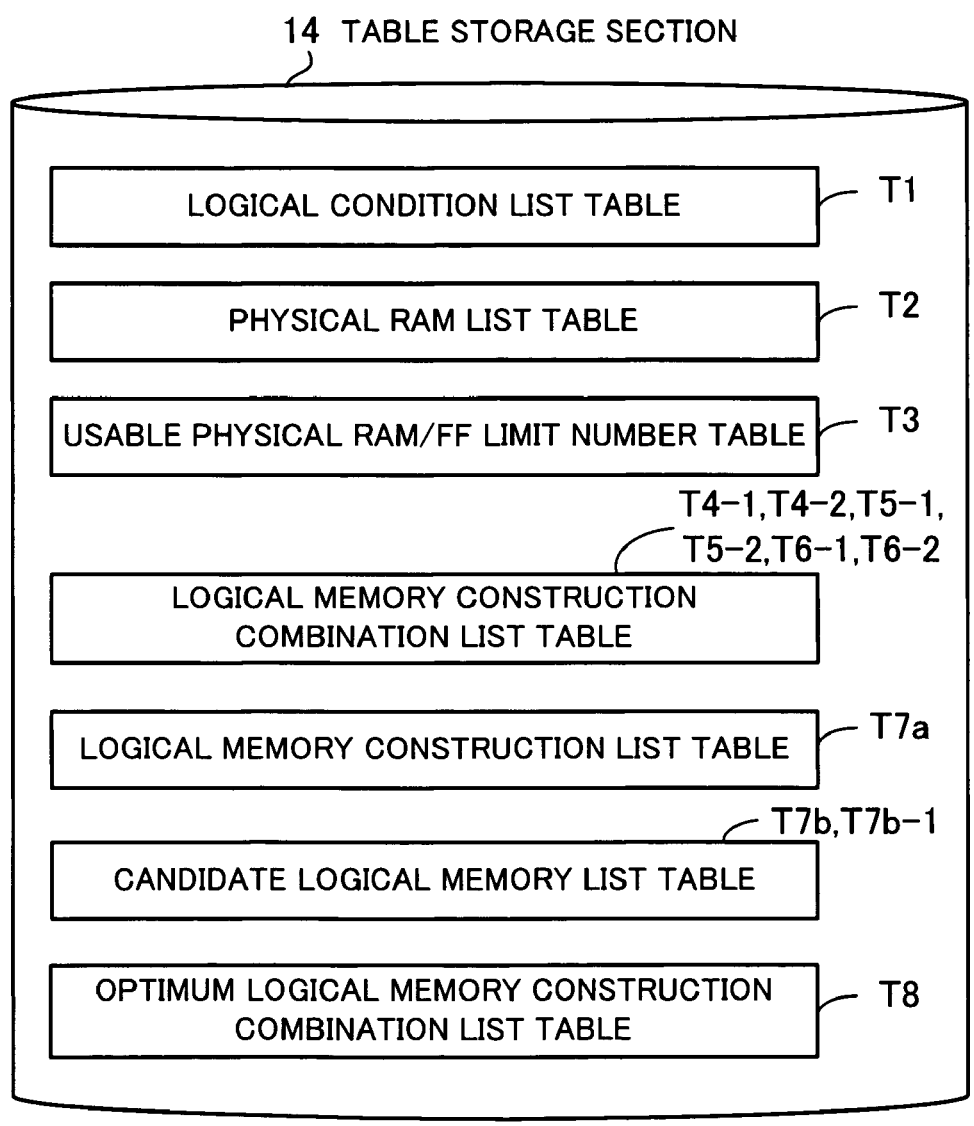
FIG. 2 is a diagram showing a construction of the table storage section.

FIG. 2 is a diagram showing the construction of the table storage section 14. The table storage section 14 stores a logical condition list table T1, a physical RAM list table T2, a usable physical RAM/FF limit number table T3, logical memory construction combination list tables T4-1, T4-2, T5-1, T5-2, T6-1, and T6-2, a logical memory construction list table T7a, candidate logical memory list tables T7b and T7b-1, and an optimum logical memory construction combination list table T8.

It should be noted that out of the above tables, the logical memory construction combination list tables T4-1, T5-1, and T6-1 are formed on a logical condition-by-logical condition basis, for entering information on the circuit configuration of each of candidate logical memories, while the logical memory construction combination list tables T4-2, T5-2, and T6-2 store the information on the circuit configurations of the candidate logical memories entered in the logical memory construction combination list tables T4-1, T5-1, and T6-1, each in a state in which the candidate logical memories are rearranged according to priorities.

The logical memory construction list table T7a is for entering circuit configuration information on candidate logical memories each corresponding to a no bit-complementing and no word-complementing state as a state of complementation by FFs that complement or make up for unfilled memory spaces.

The candidate logical memory list table T7b is for entering circuit configuration information on candidate logical memories each corresponding to a no bit-complementing and word-complementing state, a bit-complementing and no word-complementing state, and a bit-complementing and word-complementing state, as states of complementation by FFs that complement or make up for unfilled memory spaces.

The candidate logical memory list table T7b-1 stores the circuit configuration information in the candidate logical memory list table T7b in a sate in which the candidate logical memories are rearranged according to priorities. The optimum logical memory construction combination list table T8 is for entering circuit configuration information on the optimum logical memories formed by combinations of physical RAMs and FFs. The tables will be described in detail hereinafter.

Now, a description will be given of the logical condition list table T1, the physical RAM list table T2, and the usable physical RAM/FF limit number table T3. FIG. 3 is a diagram showing the logical condition list table T1. The logical condition list table T1 is comprised the items of Condition Number, Number of Bits, and Number of Words. The logical condition of a condition number 1, for example, is set such that the number of bits is 42, and the number of words is 1025. The memory construction apparatus 10 constructs such logical memories as will fill memory spaces defined by respective logical conditions 1 to 3 written in the table.

FIG. 4 is a diagram showing the physical RAM list table T2. The physical RAM list table T2 is comprised of the items of Physical RAM, Number of Bits, and Number of Words. The physical RAM of a macro 1, for example, is set such that the number of bits is 40, and the number of words is 512. This table shows various kinds of physical RAM information registered in the libraries.

FIG. 5 is a diagram showing the usable physical RAM/FF limit number table T3. The usable physical RAM/FF limit number table T3 is comprised the items of Usable Physical RAM Limit Number value, Usable FF Limit Number Value (Each), and Usable FF Limit Number Value (Total). In FIG. 5, the usable physical RAM limit number value is set to 15, the usable FF limit number value (each) to 3000, and the usable FF limit number value (total) to 10000. It should be noted that the value of the limit number of FFs that can be used for each logical condition is specifically indicated "(each)", and the value of the limit number of FFs that can be used for a total of logical conditions is specifically indicated by "total".

Figure 6:
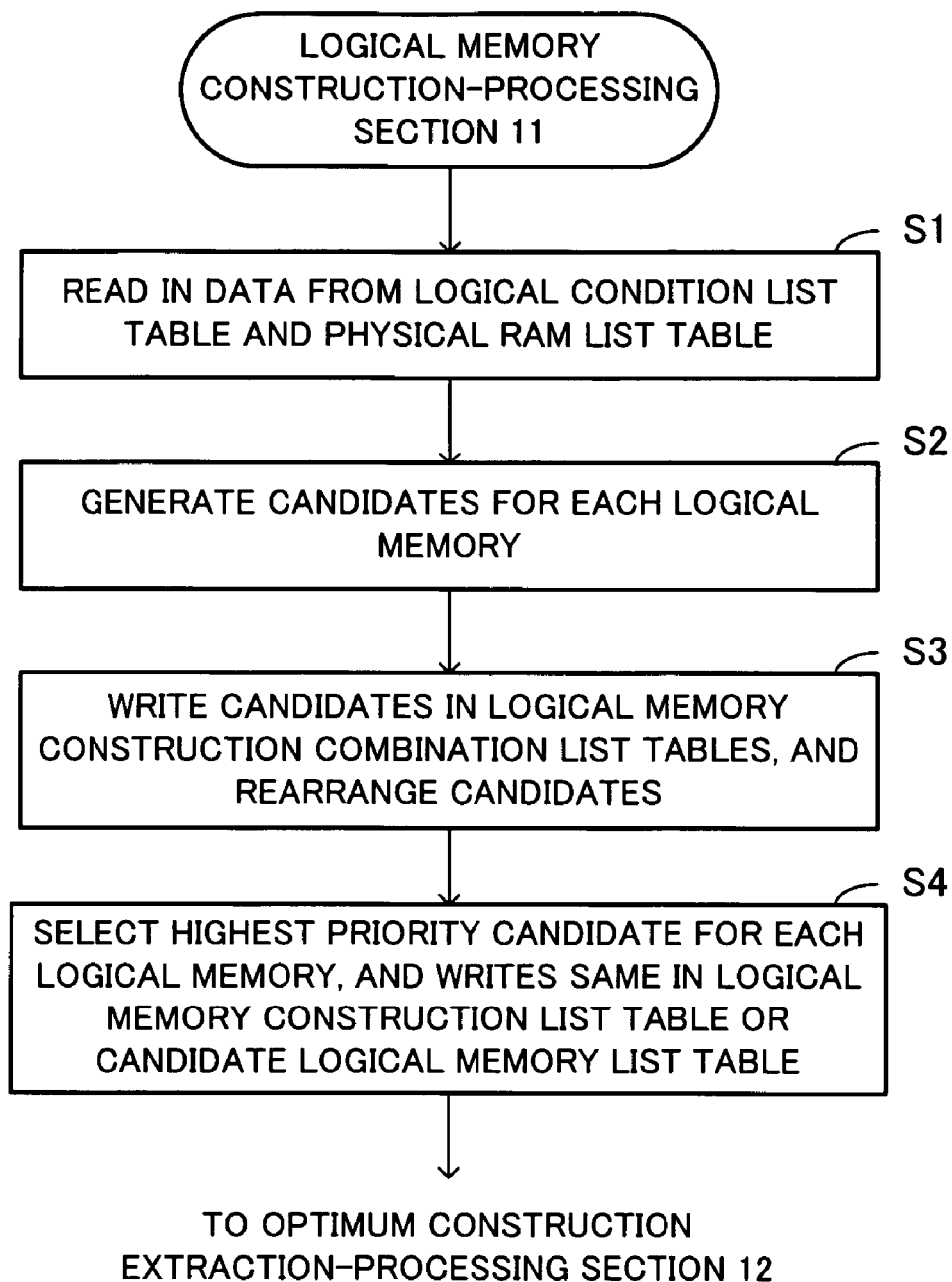
FIG. 6 is a flow diagram showing the operation of a logical memory construction-processing section.

Next, the operation of the logical memory construction-processing section 11 will be described with reference to FIGS. 7 to 13 according to the flow of process steps shown in FIG. 6. FIG. 6 is a flow diagram showing the operation of the logical memory construction-processing section 11.

[S1] The number of bits and the number of words of each of the logical conditions 1 to 3 are read out from the logical condition list table T1. Further, the number of bits and the number of words of each of the physical RAMs of the respective macros 1 to 4 are read out from the physical RAM list table T2.

[S2] Candidates for logical memories to be constructed are generated using the physical RAMs of the macros 1 to 4, and FFs that complement the shortage of bits and/or words, such that the number of bits of the logical memory and the number of words thereof, read from the logical condition list table T1, are satisfied. In this case, the logical memory is constructed by determining the number of physical RAMs as counted in the bit direction, the number of physical RAMs as counted in the word direction, the memory capacity of bit-complementing FFs, and the memory capacity of word-complementing FFs.

FIGS. 7 to 10 are diagrams showing constructions of candidate logical memories. In each figure, a horizontal direction corresponds to the number of bits, and a vertical direction to the number of words. The logical memory construction-processing section 11 operates in the following manner: first, a memory space defined by a logical condition is filled with registered physical RAMs such that the logical condition is satisfied. If the memory space defined by the logical condition cannot be suitably filled with the physical RAMs alone, the number of FFs required for complementing bits or words of the memory space is automatically calculated so as to complement an unfilled memory space (narrow space which cannot be filled when using the physical RAMs alone), whereby a candidate logical memory satisfying the logical condition is generated which is constructed using both physical RAMs and FFs.

As for calculation in the bit direction, the number of bits of the logical memory and the number of bits of the physical RAM are compared with each other, and when the number of bits of the logical memory is smaller, it is judged that no division is required in the bit direction, whereas when the number of bits of the logical memory is larger, the number of bits of the logical memory is divided by the number of bits of the physical RAM to determine the number of divisions in the bit direction and the bit size of FFs.

As for calculation in the word direction, the number of words of the logical memory and the number of words of the physical RAM are compared with each other, and when the number of words of the logical memory is smaller, it is judged that no division is required in the words direction, whereas when the number of words of the logical memory is larger, the number of words of the logical memory is divided by the number of words of the physical RAM to determine the number of divisions in the word direction and the word size of FFs. Examples thereof are illustrated in FIGS. 7 to 10, referred to hereinafter.

Figure 7:
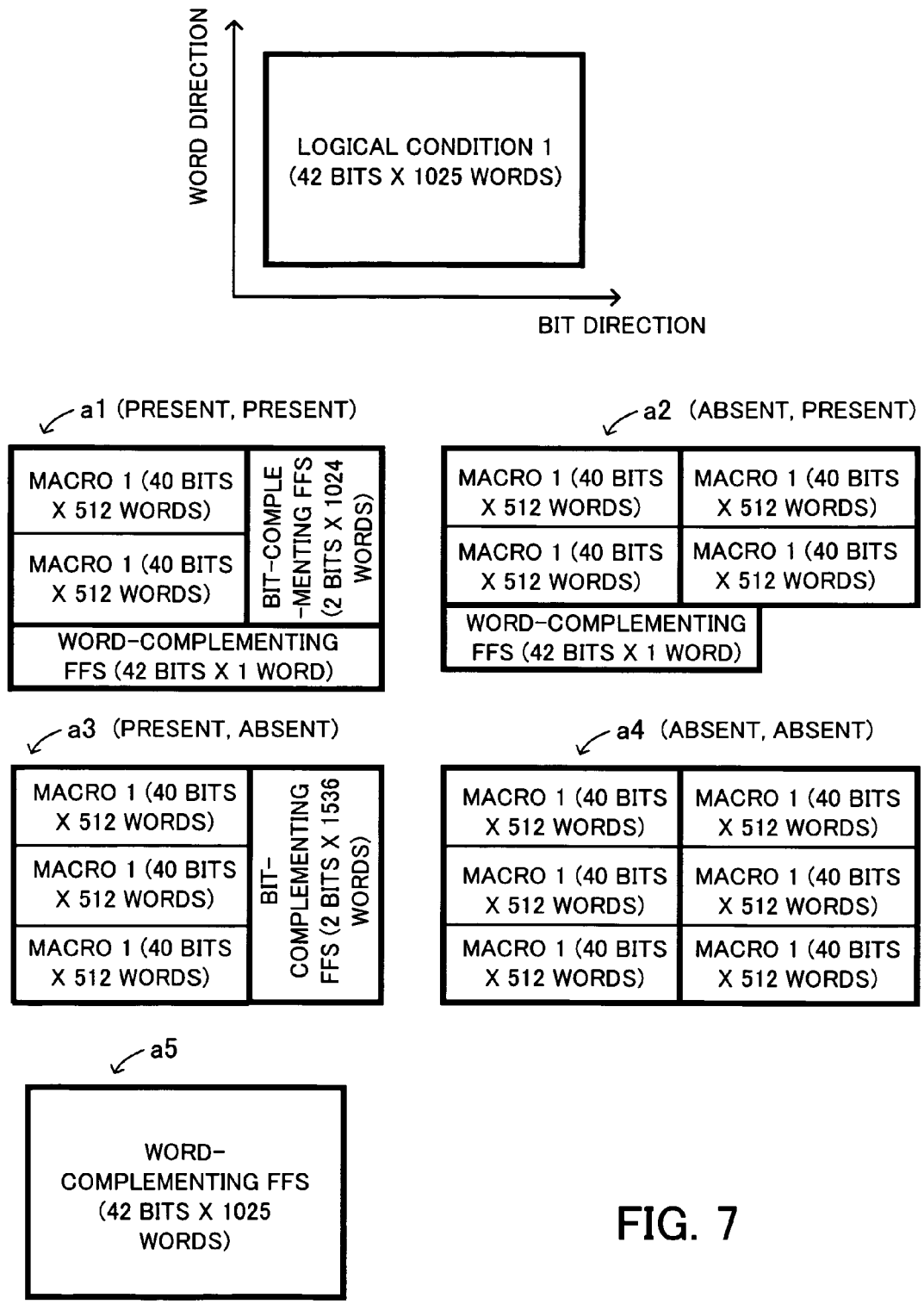
FIG. 7 is a diagram showing respective constructions of candidates for a logical memory (candidate logical memories)

FIG. 7 shows candidates for a logical memory in which the memory space of the logical condition 1 is constructed based on the physical RAM of the macro 1 in the physical RAM list table T2 (In FIG. 7, a memory (pattern a5) constructed by FFs alone is also illustrated for reference).

The logical condition 1 is defined as 42 bits×1025 words. When the logical memory is constructed using macros 1 (each of 40 bits×512 words) and additionally using FFs or not additionally using FFs, such that the logical condition 1 is satisfied, possible logical memories (candidates) are categorized into four patterns a1 to a4 depending on how FFs are used or not used.

In the pattern a1, since the macro 1 is formed by 40 bits× 512 words, two macros 1 are arranged in the word direction. Therefore, the number of words becomes 1024 (512×2). In this state, the number of bits is shorter than 42 (bits of the logical condition 1) by 2, and the number of words is shorter than 1025 (words of the logical condition 1) by 1.

Therefore, the logical memory construction-processing section 11 determines bit-complementing FFs of 2 bits×1024 words for making up for the shortage of bits, and word-complementing FFs of 42 bits×1 word for making for the shortage of words. Then, the logical memory construction-processing section 11 disposes the bit-complementing FFs at a location adjacent to the macros 1 such that the number of bits becomes 42 in total, and the word-complementing FFs at a location below the macro 1 such that the number of words becomes 1025 in total.

Therefore, by arranging two macros 1 (40 bits×512 words), one set of bit-complementing FFs (2 bits×1024 words), and one set of word-complementing FFs (42 bits×1 word), as shown in FIG. 7, it is possible to construct the logical memory of 42 bits×1025 words, defined by the logical condition 1. Other candidate logical memories are also constructed by respective processes similar to the above.

It should be noted that in the case of the logical memory of the pattern a1, in which the bit-complementing FFs and the word-complementing FFs are both used ((bit-complementing FF, word-complementing FF)=(present, present)), there are determined the number of physical RAMs in the bit direction as being equal to 1 (the number of the physical RAMs in the bit direction=1), the number of physical RAMs in the word direction as being equal to 2 (the number of physical RAMs in the word direction=2), the memory capacity of bit-complementing FFs as 2 bits×1024 words (the memory capacity of bit-complementing FFs=2 bits×1024 words), and the memory capacity of word-complementing FFs as 42 bits×1 word (the memory capacity of word-complementing FFs=42 bits×1 word).

Similarly, in the case of the logical memory of the pattern a2 in which (bit-complementing FF, word-complementing FF)=(absent, present) holds, there are determined the number of physical RAMs in the bit direction=2, the number of physical RAMs in the word direction=2, and the memory capacity of word-complementing FFs=42 bits×1 word. In the case of the logical memory of the pattern a3 in which (bit-complementing FF, word-complementing FF)=(present, absent) holds, there are determined the number of physical RAMs in the bit direction=1, the number of physical RAMs in the word direction=3, and the memory capacity of bit-complementing FFs=2 bits×1536 words. In the case of the logical memory of the pattern a4 in which (bit-complementing FF, word-complementing FF)=(absent, absent) holds, there are determined the number of physical RAMs in the bit direction=2, the number of physical RAMs in the word direction=3. The logical memory of the pattern a5 is constructed using word-complementing FFs (42 bits×1025 words) alone.

Figure 8:
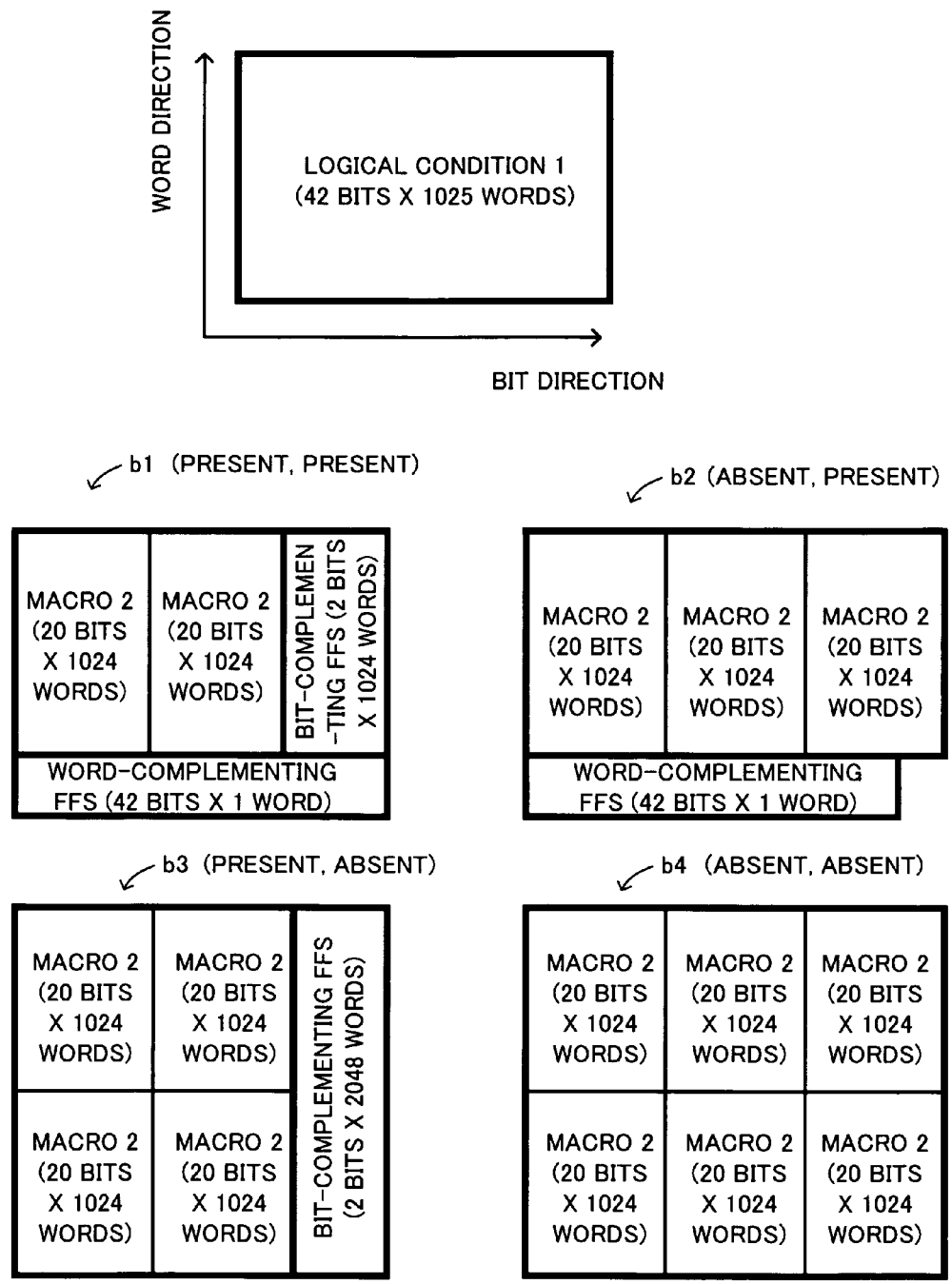
FIG. 8 is a diagram showing respective constructions of candidate logical memories.

FIG. 8 shows candidates for the logical memory in which the memory space of the logical condition 1 is constructed based on the physical RAM of the macro 2 in the physical RAM list table T2. When the logical memory is constructed by using macros 2 (each of 20 bits×1024 words) and additionally using FFs or not additionally using FFs, such that the logical condition 1 of 42 bits×1025 words is satisfied, possible logical memories (candidates) are categorized into four patterns b1 to b4, depending on how FFs are used.

In the case of the logical memory of the pattern b1 in which (bit-complementing FF, word-complementing FF)=(present, present) holds, there are determined the number of physical RAMs in the bit direction=2, the number of physical RAMs in the word direction=1, the memory capacity of bit-complementing FFs=2 bits×1024 words, and the memory capacity of word-complementing FFs=42 bits×1 word.

In the case of the logical memory of the pattern b2 in which (bit-complementing FF, word-complementing FF)=(absent, present) holds, there are determined the number of physical RAMs in the bit direction=3, the number of physical RAMs in the word direction=1, and the memory capacity of word-complementing FFs=42 bits×1 word. In the case of the logical memory of the pattern b3 in which (bit-complementing FF, word-complementing FF)=(present, absent) holds, there are determined the number of physical RAMs in the bit direction=2, the number of physical RAMs in the word direction=2, and the memory capacity of bit-complementing FFs=2 bits×2048 words. In the case of the logical memory of the pattern b4 in which (bit-complementing FF, word-complementing FF)=(absent, absent) holds, there are determined the number of physical RAMs in the bit direction=3, and the number of physical RAMs in the word direction=2.

Figure 9:
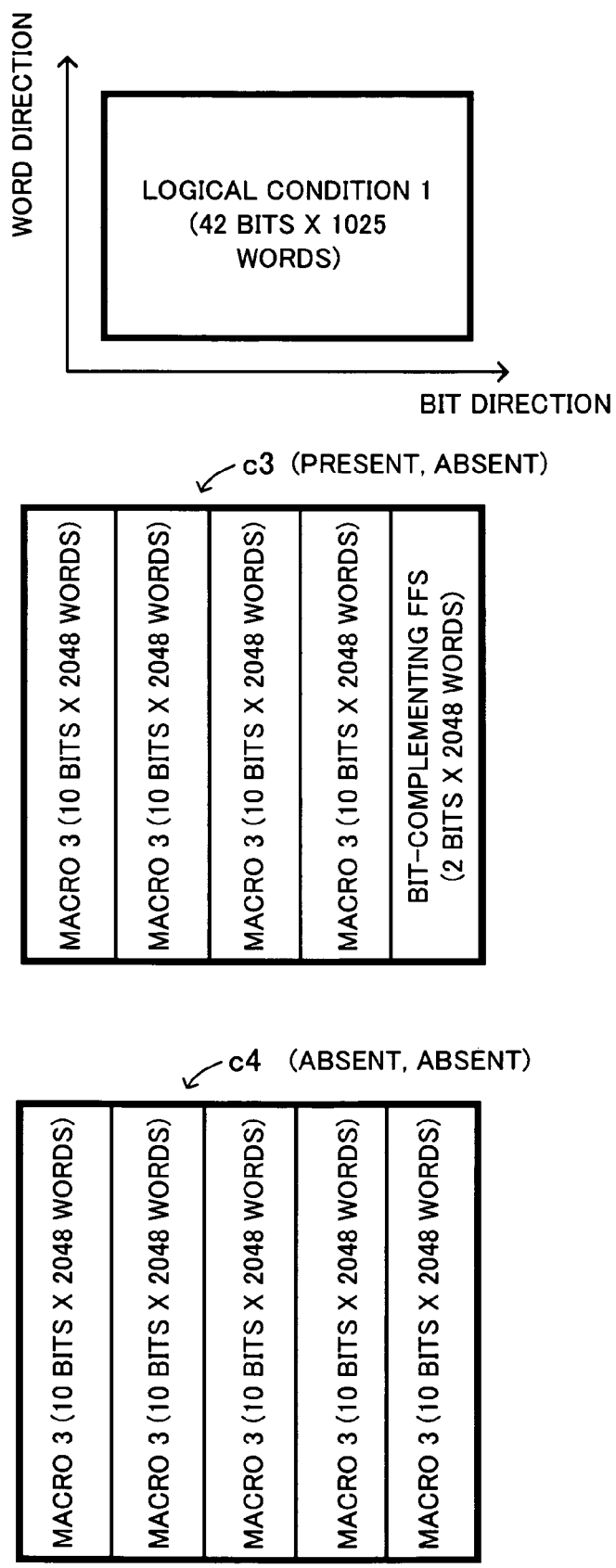
FIG. 9 is a diagram showing respective constructions of candidate logical memories.

FIG. 9 shows candidates for the logical memory, in which the memory space of the logical condition 1 is constructed based on the physical RAM of the macro 3 in the physical RAM list table T2. When the logical memory is constructed by using macros 3 (each of 10 bits×2048 words) and additionally using FFs or not additionally using FFs, such that the logical condition 1 of 42 bits×1025 words is satisfied, possible logical memories (candidates) are categorized into two patterns c3 and c4 depending on how FFs are used (since the macro 3 has 2048 words which exceeds 1025 words of the condition, there is no need to form a pattern including word-complementing FFs).

In the case of the logical memory of the pattern c3 in which (bit-complementing FF, word-complementing FF)=(present, absent) holds, there are determined the number of physical RAMs in the bit direction=4, the number of physical RAMs in the word direction=1, and the memory capacity of bit-complementing FFs=2 bits×2048 word. In the case of the logical memory of the pattern c4 in which (bit-complementing FF, word-complementing FF)=(absent, absent) holds, there are determined the number of physical RAMs in the bit direction=5, and the number of physical RAMs in the word direction=1.

Figure 10:
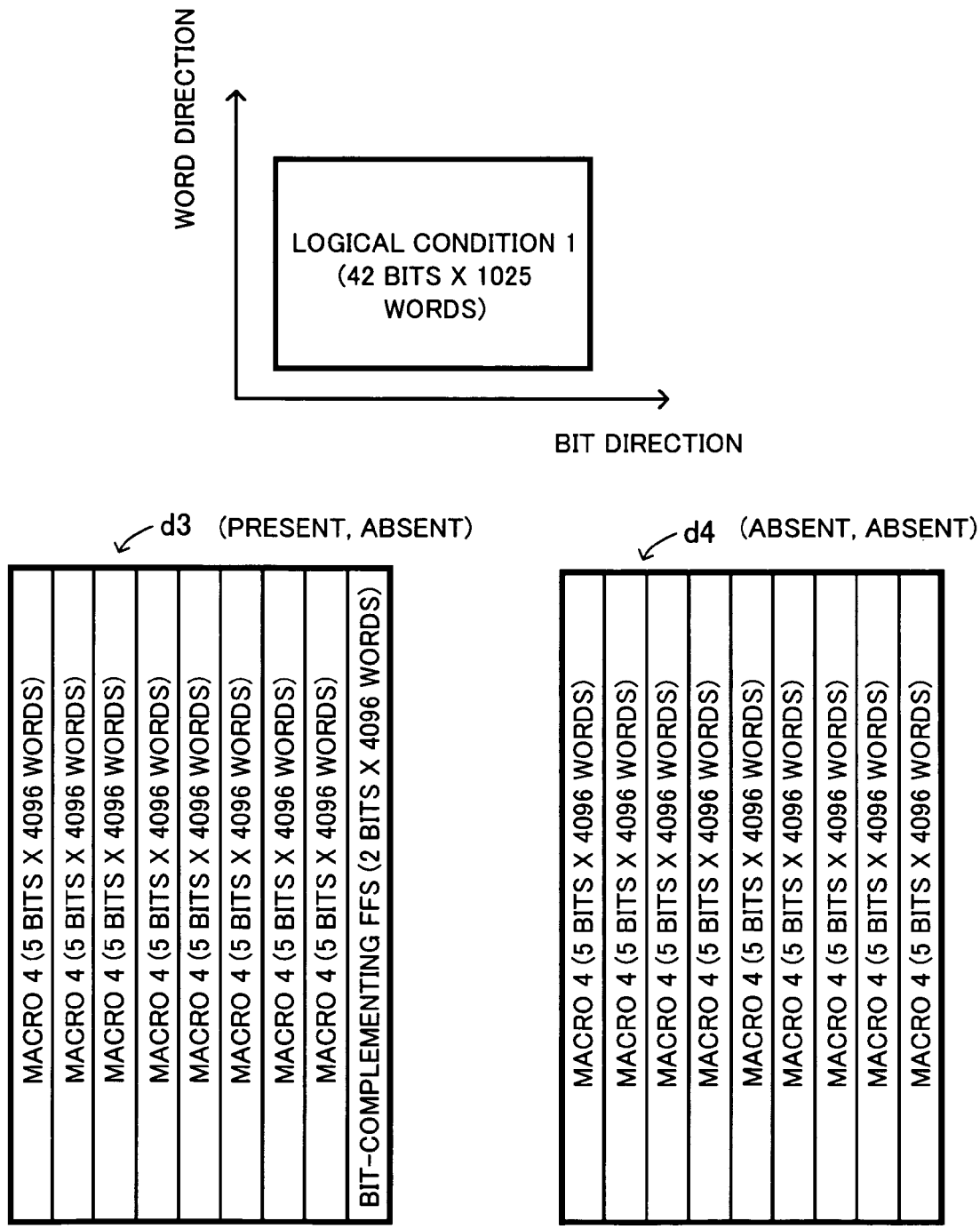
FIG. 10 is a diagram showing respective constructions of candidate logical memories.

FIG. 10 shows candidates for the logical memory, in which the memory space of the logical condition 1 is constructed based on the physical RAM of the macro 4 in the physical RAM list table T2. When the logical memory is constructed by using macros 4 (each defined by 5 bits×4096 words) and additionally using FFs or not additionally using FFs, such that the logical condition 1 of 42 bits×1025 words is satisfied, possible logical memories (candidates) are categorized into two patterns d3 and d4 depending on how FFs are used (since the macro 4 has 4096 words which exceeds 1025 words of the condition, there is no need to form a pattern including word-complementing FFs).

In the case of the logical memory of the pattern d3 in which (bit-complementing FF, word-complementing FF)=(present, absent) holds, there are determined the number of physical RAMs in the bit direction=8, the number of physical RAMs in the word direction=1, and the memory capacity of bit-complementing FFs=2 bits×4096 words. In the case of the logical memory of the pattern d4 in which (bit-complementing FF, word-complementing FF)=(absent, absent) holds, there are determined the number of physical RAMs in the bit direction=9, and the number of physical RAMs in the word direction=1.

As described above, the logical memory construction-processing section 11 generates candidate logical memories each satisfying one of logical conditions set in the logical condition list table T1, by using memory macros of physical RAMs registered in the physical RAM list table T2 and additionally using bit-complementing FFs and/or word-complementing FFs, which are calculated when the memory macros do not provide enough bits and/or words to satisfy the condition. It should be noted that although in FIGS. 7 to 10, the candidate logical memories satisfying the logical condition 1 are shown, candidate logical memories satisfying the logical conditions 2 and 3 are also generated similarly to the above (although not shown).

Next, a description will be given of operations performed in a step S3 following the step S2 shown in FIG. 6.

[S3] After generation of each candidate logical memory corresponding to the associated logical condition, the logical memory construction-processing section 11 writes circuit configuration information on each candidate in the associated one of the logical memory construction combination list tables T4-1, T5-1, and T6-1, and at the same time rearranges the circuit configuration information, i.e. the candidates in each table according to priorities.

FIGS. 11A and 11B show the logical memory construction combination list tables T4-1 and T4-2, respectively. The logical memory construction combination list table T4-1 shows the circuit configuration information on the candidate logical memories, obtained when the candidates were calculated and generated such that the logical condition 1 is satisfied, in a tabular form, and the logical memory construction combination list table T4-2 is formed by rearranging the candidates in the table T4-1 according to priorities, described hereinafter.

The logical memory construction combination list tables T4-1 is formed by the items of Item Number, Bit Complement, Word Complement, Physical RAM, Number of Bits, Number of Words, Number of Physical RAMs in Bit Direction, Number of Physical RAMs in Word Direction, Total Number of Physical RAMs, Number of Bit-Complementing FFs, Number of Word-Complementing FFs, and Total Number of FFs.

Out of the candidate logical memories satisfying the logical condition 1 of 42 bits×1025 words, Item number 13, for example, shows one defined by (bit-complementing FF, word-complementing FF)=(present, present), the use of the macro 1 having the number of bits=40 and the number of words=512, the number of physical RAMs in the bit direction=1, the number of physical RAMs in the word direction=2, the total number of physical RAMs=2, the number of bit-complementing FFs=2 bits×1024 words, the number of word-complementing FFs=42 bits×1 word, and the total number of FFs=2090.

It should be noted that Item numbers 7, 8, 15, and 16, in which (bit-complementing FF, word-complementing FF)=(absent, present) or (present, present) holds and physical RAMs having a larger number of words than the number of words=1025 of the logical condition 1 are used show the number of physical RAMs and the number of FFs set to 0, since there is no need to complement any words.

The logical memory construction combination list table T4-2 is formed by rearranging the candidates in the table T4-1 according to priorities, after classifying them into groups according to the type of (bit-complementing FF, word-complementing FF).

The rearrangement performed according to priorities is such that candidates are sequentially arranged from an upper row in the increasing order of the total number of physical RAMs, and candidates having the same number of physical RAMs are sequentially arranged from an upper row in the increasing order of the number of physical RAMs in the word direction. Further, candidates having the same number of physical RAMs in the word direction are sequentially arranged from an upper row in the increasing order of the total number of FFs. Thus, as a candidate is located in an upper row in each group, it is given a higher priority for selection as a logical memory.

That is, priorities given to logical memories to be constructed are such that that smallness in the total number of physical RAMs is given a highest priority (for reduction of the number of physical RAMs in use), that smallness in the number of physical RAMs in the word direction is given a second highest priority (for reduction of the number of address decodes in the word direction), and that smallness in the total number of FFs is given a third highest priority (for reduction of the number of FFs in use). (It should be noted that as to the groups of candidates of (bit-complementing FF, word-complementing FF) types, the group of (bit-complementing FF, word-complementing FF)=(absent, absent) type is disposed in the uppermost rows of the table, and the group of (bit-complementing FF, word-complementing FF)=(present, present) type is disposed in the lowermost rows of the table, such that a group of candidates each using a smaller number of FFs are disposed in upper rows of the table).

Similarly, the logical memory construction combination list tables T5-1, T5-2, T6-1, and T6-2, which correspond to the logical conditions 2 and 3, respectively, are shown in FIGS. 12A and 12B, and FIGS. 13A and 13B. The logical memory construction combination list table T5-1, shown in FIG. 12A, shows the circuit configuration information on the candidate logical memories, obtained when the candidates were calculated and generated such that the logical condition 2 is satisfied, in a tabular form, and the logical memory construction combination list table T5-2, shown in FIG. 12B, is formed by rearranging the candidates in the table T5-1 according to the same priorities as described above, after classifying them into groups corresponding to the types of (bit-complementing FF, word-complementing FF), It should be noted that Item numbers 8, 12, and 16, in which (bit-complementing FF, word-complementing FF)=(absent, present), (present, absent), or (present, present) holds and physical RAMs having a larger number of words than the number of words=2100 of the logical condition 2 are used show the number of physical RAMs and the number of FFs set to 0 since there is no need to complement any words.

Further, the logical memory construction combination list table T6-1 in FIG. 13A shows the circuit configuration information on the candidate logical memories, obtained when the candidates were calculated and generated such that the logical condition 3 is satisfied, in a tabular form, and the logical memory construction combination list table T6-2 in FIG. 13B is formed by rearranging the candidates in the table T6-1 according to the same priorities as described above after classifying them into groups corresponding to the types of (bit-complementing FF, word-complementing FF).

It should be noted that Item numbers 9 and 13 in which (bit-complementing FF, word-complementing FF)=(present, absent) or (present, present) holds and physical RAMs having a larger number of bits than the number of bits=36 of the logical condition 3 are used show the number of physical RAMs and the number of FFs set to 0 since there is no need to complement any bits.

Next, a description will be given of operations performed in a step S4 in FIG. 6.

[S4] The logical memory construction-processing section 11 selects the highest priority candidates for the logical memories from the logical memory construction combination list tables T4-2, T5-2, and T6-2 prepared in association with the respective logical conditions 1 to 3, and writes the highest priority candidates in the logical memory construction list table T7a or the candidate logical memory list table T7b (i.e. data of category type (absent, absent) is written in the logical memory construction list table T7a, and data of category types (absent, present), (present, absent), and (present, present) is written in the candidate logical memory list table T7b).

FIG. 14 is a diagram showing the logical memory construction list table. In the FIG. 14 logical memory construction list table T7a, there is written information on the highest priority candidates for the logical memories with (bit-complementing FF, word-complementing FF)=(absent, absent), which satisfy the logical conditions 1 to 3, respectively.

The logical memory construction-processing section 11 selects a highest priority candidate (corresponding to Item number 3 in the table T4-2) with (bit-complementing FF, word-complementing FF)=(absent, absent) from the logical memory construction combination list table T4-2 prepared in association with the logical condition 1, and writes the highest priority candidate in the logical memory construction list table T7a.

Similarly, the logical memory construction-processing section 11 selects a highest priority candidate (corresponding to Item number 2 in the table T5-2) with (bit-complementing FF, word-complementing FF)=(absent, absent) from the logical memory construction combination list table T5-2 prepared in association with the logical condition 2, and writes the highest priority candidate in the logical memory construction list table T7a. Further, the logical memory construction-processing section 11 selects a highest priority candidate (corresponding to Item number 1 in the table T6-2) with (bit-complementing FF, word-complementing FF)=(absent, absent) from the logical memory construction combination list table T6-2 prepared in association with the logical condition 3, and writes the highest priority candidate in the logical memory construction list table T7a.

FIG. 15 is a diagram showing the candidate logical memory list table T7b. In the FIG. 15 candidate logical memory list table T7b, there is written information on the highest priority candidates for the logical memories with (bit-complementing FF, word-complementing FF)=(absent, present), (present, absent), or (present, present), each of which satisfies any of the logical conditions 1 to 3.

The logical memory construction-processing section 11 selects a highest priority candidate (corresponding to Item number 6 in the table T4-2) with (bit-complementing FF, word-complementing FF)=(absent, absent) from the logical memory construction combination list table T4-2 prepared in association with the logical condition 1, and writes the highest priority candidate in the candidate logical memory list table T7b as a candidate with Item number 1.

Further, the logical memory construction-processing section 11 selects a highest priority candidate (corresponding to Item number 9 in the table T4-2) with (bit-complementing FF, word-complementing FF)=(present, absent) in the logical memory construction combination list table T4-2 prepared in association with the logical condition 1, and writes the highest priority candidate in the candidate logical memory list table T7b as a candidate with Item number 2. Further, the logical memory construction-processing section 11 selects a highest priority candidate (corresponding to Item number 14 in the table T4-2) with (bit-complementing FF, word-complementing FF)=(present, present) from the logical memory construction combination list table T4-2 prepared in association with the logical condition 1, and writes the highest priority candidate in the candidate logical memory list table T7b as a candidate with Item number 3. Furthermore, the logical memory construction-processing section 11 writes a logical memory constructed by FFs alone in the candidate logical memory list table T7b as a candidate with Item number 4.

Similarly, highest priority candidates (corresponding to Item numbers 7, 9, and 15 in the table T5-2) respectively with (bit-complementing FF, word-complementing FF)=(absent, present), (present, absent), and (present, present) in the logical memory construction combination list table T5-2 prepared in association with the logical condition 2, and a logical memory constructed by FFs alone are written in the candidate logical memory list table T7b as candidates with Item numbers 5 to 8. Further, highest priority candidates (corresponding to Item numbers 7, 10, and 14 in the table T6-2) respectively with (bit-complementing FF, word-complementing FF)=(absent, present), (present, absent), and (present, present) in the logical memory construction combination list table T6-2 prepared in association with the logical condition 3, and a logical memory constructed by FFs alone are written in the candidate logical memory list table T7b as candidates with Item numbers 9 to 12.

FIG. 16 is a diagram showing the candidate logical memory list table T7b-1. The FIG. 16 candidate logical memory list table T7b-1 is formed by rearranging the candidate logical memories in the table T7b according to priorities.

More specifically, the rearrangement performed according to priorities is such that candidates are sequentially arranged from the top row in the increasing order of the total number of FFs, and candidates having the same total number of FFs are arranged from an upper row in a decreasing order of physical RAMS. In other words, priorities given to logical memories to be constructed are such that smallness in the total number of FFs is given a highest priority (for reduction of the number of FFs in use), and largeness in the number of the physical RAMs is given a second highest priority (for preferentially using smaller physical RAMs).

Figure 17:
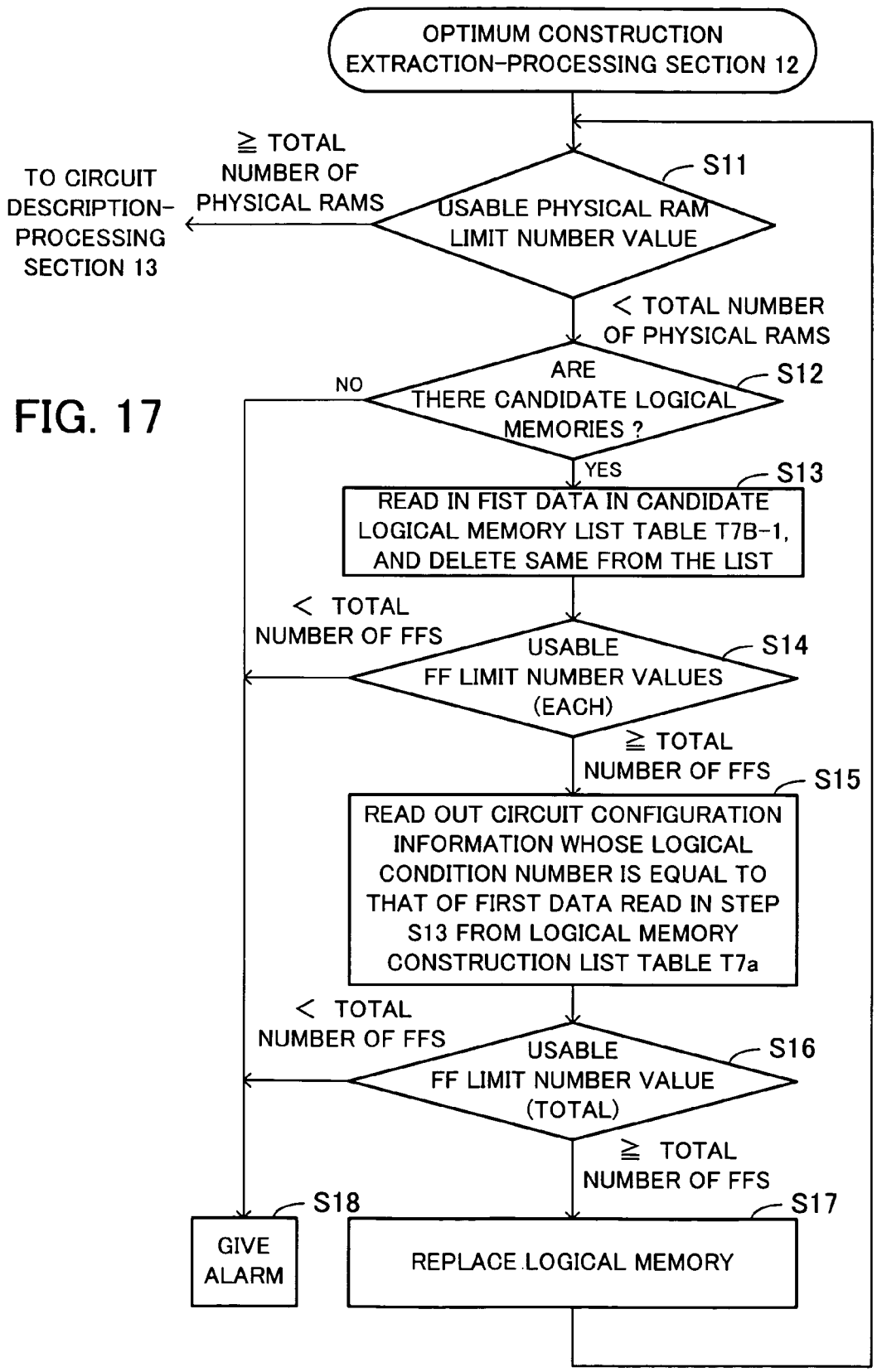
FIG. 17 is a flow diagram showing process steps of the operation of the optimum construction extraction-processing section.

Next, a description will be given of the operation of the optimum construction extraction-processing section 12. FIG. 17 is a flow diagram showing process steps of the operation of the optimum construction extraction-processing section 12.

[S11] The optimum construction extraction-processing section 12 performs comparison between a total sum of the total numbers of physical RAMs (physical RAM total sum) written in the logical memory construction list table T7a and the usable physical RAM limit number value written in the usable physical RAM/FF limit number table T3.

When the physical RAM total sum $\leqq$ the usable physical RAM limit number value holds, the process proceeds to a process carried out by the circuit description-processing section 13, whereas when the physical RAM total sum > the usable physical RAM limit number value holds, the process proceeds to a step S12.

More specifically, from the logical memory construction list table T7a, the total sum of the total numbers of the physical RAMs is equal to 5+9+9=23, and from the usable physical RAM/FF limit number table T3, the usable physical RAM limit number value is equal to 15, so that the physical RAM total sum exceeds the number of usable physical RAMs, and hence the process proceeds to the step S12 to find another candidate logical memory.

[S12] The optimum construction extraction-processing section 12 determines whether or not the candidate logical memory list table T7b-1 contains a candidate for any of the logical memories. When there is no candidate, the process proceeds to a step S18, whereas when a candidate is found, the process proceeds to a step S13.

[S13] The optimum construction extraction-processing section 12 reads first data in the candidate logical memory list table T7b-1 (circuit configuration information on the candidate entered in the top row of the table), and deletes the first data from the candidate logical memory list table T7b-1. In other words, the candidate with Item number 1 in the FIG. 16 candidate logical memory list table T7b-1 is read out as the first data, and then is deleted from the list.

[S14] The optimum construction extraction-processing section 12 performs comparison between the usable FF limit number value (each) in the usable physical RAM/FF limit number table T3 and the total number of FFs of the first data read in the step S13. When the usable FF limit number values (each) < the total number of FF holds, the process proceeds to the step S18, whereas when the usable FF limit number values (each) $\geqq$ the total number of FFs holds, the process proceeds to a step S15.

In the illustrated example, from the usable physical RAM/FF limit number table T3, the usable FF limit number value (each) is equal to 3000, and the total number of FFs of the first data read in the step S13 is equal to 42, so that the process proceeds to the step S15.

[S15] The optimum construction extraction-processing section 12 reads out circuit configuration information whose logical condition number is equal to that of the first data read in the step S13. Here, the optimum construction extraction-processing section 12 reads out the circuit configuration information associated with the logical condition 1 from the FIG. 14 logical memory construction list table T7a.

[S16] The optimum construction extraction-processing section 12 performs comparison between the usable FF limit number value (total) in the usable physical RAM/FF limit number table T3, and the total sum of FFs in the logical memory construction list table T7a, which is to be obtained when the circuit configuration information read out from the logical memory construction list table T7a in the step S15 is replaced by the first data read in the step S13.

When the usable FF limit number value (total) < the total of FF holds, the process proceeds to the step S18, whereas when the usable FF limit number value (total) ≧ the total sum of the FF holds, the process proceeds to a step S17.

In the illustrated example, from the usable physical RAM/FF limit number table T3, the usable FF limit number value (total) is equal to 10000, and the total of FFs after the replacement is equal to 42+0+0=42, so that the process proceeds to the step S17 (It should be noted that the expression "42+0+0" is intended to mean that 42 (total number of FFs associated with the logical condition 1, obtained after the replacement)+0 (total number of FFs associated with the logical condition 2 in the table T7a)+0 (total number of FFs associated with the logical condition 3 in the table T7a).

[S17] The optimum construction extraction-processing section 12 replaces the circuit configuration information read out from the logical memory construction list table T7a in the step S15 by the first data read in the step S13. In the illustrated example, the circuit configuration information associated with the logical condition 1 in the FIG. 14 logical memory construction list table T7a is replaced by the first data in the FIG. 16 candidate logical memory list table T7b-1. Therefore, the total sum of the total numbers of the physical RAMs become equal to 3+9+9=21, which means that the total number of physical RAMs before the replacement is reduced by 2.

[S18] The optimum construction extraction-processing section 12 gives an alarm.

Similarly, in a second process in the steps S11 to S17, circuit configuration information associated with the logical condition 3 in the FIG. 14 logical memory construction list table T7a is replaced by circuit configuration information on the candidate represented by Item number 9 in the FIG. 16 candidate logical memory list table T7b-1; in a third process, circuit configuration information associated with the logical condition 1 in FIG. 14 is replaced by circuit configuration information on the candidate represented by Item number 3 in FIG. 16; in a fourth process, circuit configuration information associated with the logical condition 2 in FIG. 14 is replaced by circuit configuration information on the candidate represented by Item number 5 in FIG. 15; after the fourth process, the total sum of the total numbers of physical RAMs and the usable physical RAM limit number value become equal to each other, whereby the logical memory construction list table T7a is finally replaced by the optimum logical memory construction combination list table.

FIG. 18 is a diagram showing the optimum logical memory construction combination list table T8. The table T8 shows optimum logical memory constructions that satisfy the logical conditions 1 to 3, respectively, (smallest in the number of usable FFs, and largest in the number of physical RAMs).

It should be noted that respective flows of the first to fifth processes in the FIG. 17 operation flow will be described hereinafter. FIGS. 19 to 21 are diagrams showing a sequence of changes in the circuit configuration information in the logical memory construction list table T7a, which results from the respective replacement operations.

(First Process)
In the step S11,
The total number of physical RAMs in the logical memory construction list table T7a:

$$5+9+9=23 \qquad (1\text{-}1)$$

The usable physical RAM limit number value in the usable physical RAM/FF limit number table T3:

$$15 \qquad (1\text{-}2)$$

Since (1-1)>(1-2) holds, the process proceeds to the branch of the step S12. Since there are candidate logical memories, the process proceeds to the step S13, wherein the first data in the candidate logical memory list table T7b-1 is read in, and is deleted from the table.

In the step S14,
The total number of FFs of the first data read in the step S13:

$$42 \qquad (1\text{-}3)$$

The usable FF limit number value (each) in the usable physical RAM/FF limit number table T3:

$$3000 \qquad (1\text{-}4)$$

Since (1-3)<(1-4) holds, the process proceeds to the branch of the step S15, wherein the circuit configuration information associated with the logical condition number 1 in the logical memory construction list table T7a is read out.

In the step S16,
The total of FFs in the table T7a, which is to be obtained when the circuit configuration information read from the logical memory construction list table T7a in the step S15 is replaced by the first data read in the step S13:

$$42+0+0=42 \qquad (1\text{-}5)$$

The usable FF limit number value (total) in the usable physical RAM/FF limit number table T3:

$$10000 \qquad (1\text{-}6)$$

Since (1-5)<(1-6) holds, the process proceeds to the branch of the step S17, wherein the circuit configuration information, which was read in the step S15, in the logical memory construction list table T7a is replaced by the first data read in the step S13, followed by the process returning to the step 11.

(Second Process)
In step S11,
The total number of physical RAMs in the logical memory construction list table T7a:

$$3+9+9=21 \qquad (2\text{-}1)$$

The usable physical RAM limit number value in the usable physical RAM/FF limit number table T3:

$$15 \qquad (2\text{-}2)$$

Since (2-1)>(2-2) holds, the process proceeds to the branch of the step S12. Since there are candidate logical memories, the process proceeds to the step S13, wherein the first data (which now corresponds to data with Item number 9) in the candidate logical memory list table T7b-1 is read in, and is deleted from the table.

In the step S14,
The total number of FFs of the first data read in the step S13:

$$144 \qquad (2\text{-}3)$$

The usable FF limit number value (each) in the usable physical RAM/FF limit number table T3:

$$3000 \qquad (2\text{-}4)$$

Since (2-3)<(2-4) holds, the process proceeds to the branch of the step S15, wherein the circuit configuration information associated with the logical condition number 3 in the logical memory construction list table T7a is read out.

In the step S16,

The total of FFs in the table T7a, which is to be obtained when the circuit configuration information read from the logical memory construction list table T7a in the step S15 is replaced by the first data read in the step S13:

$$42+0+144=186 \qquad (2\text{-}5)$$

The usable FF limit number value (total) in the usable physical RAM/FF limit number table T3:

$$10000 \qquad (2\text{-}6)$$

Since (2-5)<(2-6) holds, the process proceeds to the branch of the step S17, wherein the circuit configuration information, which was read in the step S15, in the logical memory construction list table T7a is replaced by the first data read in the step S13, followed by the process returning to the step 11.

(Third Process)

In the step S11,

The total number of physical RAMs in the logical memory construction list table T7a:

$$3+9+8=20 \qquad (3\text{-}1)$$

The usable physical RAM limit number value in the usable physical RAM/FF limit number table T3:

$$15 \qquad (3\text{-}2)$$

Since (3-1)>(3-2) holds, the process proceeds to the branch of the step S12. Since there are candidate logical memories, the process proceeds to the step S13, wherein the first data (which now corresponds to data with Item number 3) in the candidate logical memory list table T7b-1 is read in, and is deleted from the table.

In the step S14,

The total number of FFs of the first data read in the step S13:

$$2090 \qquad (3\text{-}3)$$

The usable FF limit number value (each) in the usable physical RAM/FF limit number table T3:

$$3000 \qquad (3\text{-}4)$$

Since (3-3)<(3-4) holds, the process proceeds to the branch of the step S15, wherein the circuit configuration information associated with the logical condition number 1 in the logical memory construction list table T7a is read out.

In the step S16,

The total of FFs in the table T7a, which is to be obtained when the circuit configuration information read from the logical memory construction list table T7a in the step S15 is replaced by the first data read in the step S13:

$$2090+0+144=2234 \qquad (3\text{-}5)$$

The usable FF limit number value (total) in the usable physical RAM/FF limit number table T3:

$$10000 \qquad (3\text{-}6)$$

Since (3-5)<(3-6) holds, the process proceeds to the branch of the step S17, wherein the circuit configuration information, which was read in the step S15, in the logical memory construction list table T7a is replaced by the first data read in the step S13, followed by the process returning to the step 11.

(Fourth Process)

In the step S11,

The total number of physical RAMs in the logical memory construction list table T7a:

$$2+9+8=19 \qquad (4\text{-}1)$$

The usable physical RAM limit number value in the usable physical RAM/FF limit number table T3:

$$15 \qquad (4\text{-}2)$$

Since (4-1)>(4-2) holds, the process proceeds to the branch of the step S12. Since there are candidate logical memories, the process proceeds to the step S13, wherein the first data (which now corresponds to data with Item number 5) in the candidate logical memory list table T7b-1 is read in, and is deleted from the table.

In the step S14,

The total number of FFs of the first data read in the step S13:

$$2600 \qquad (4\text{-}3)$$

The usable FF limit number value (each) in the usable physical RAM/FF limit number table T3:

$$3000 \qquad (4\text{-}4)$$

Since (4-3)<(4-4) holds, the process proceeds to the branch of the step S15, wherein the circuit configuration information associated with the logical condition number 2 in the logical memory construction list table T7a is read out.

In the step S16,

The total of usable FFs in the table T7a, which is to be obtained when the circuit configuration information read from the logical memory construction list table T7a in the step S15 is replaced by the first data read in the step S13:

$$2090+2600+144=4834 \qquad (4\text{-}5)$$

The usable FF limit number value (total) in the usable physical RAM/FF limit number table T3:

$$10000 \qquad (4\text{-}6)$$

Since (4-5)<(4-6) holds, the process proceeds to the branch of the step S17, wherein the circuit configuration information, which was read in the step S15, in the logical memory construction list table T7a is replaced by the first data read in the step S13, followed by the process returning to the step 11.

(Fifth Process)

In the step S11,

The total number of physical RAMs in the logical memory construction list table T7a:

$$2+5+8=15 \qquad (5\text{-}1)$$

The usable physical RAM limit number value in the usable physical RAM/FF limit number table T3:

$$15 \qquad (5\text{-}2)$$

Since (5-1)=(5-2) holds, the process by the optimum construction extraction-processing section 12 is terminated, and the logical memory construction list table T7a is thus finally formed into the optimum logical memory construction combination list table T8.

Figure 22:
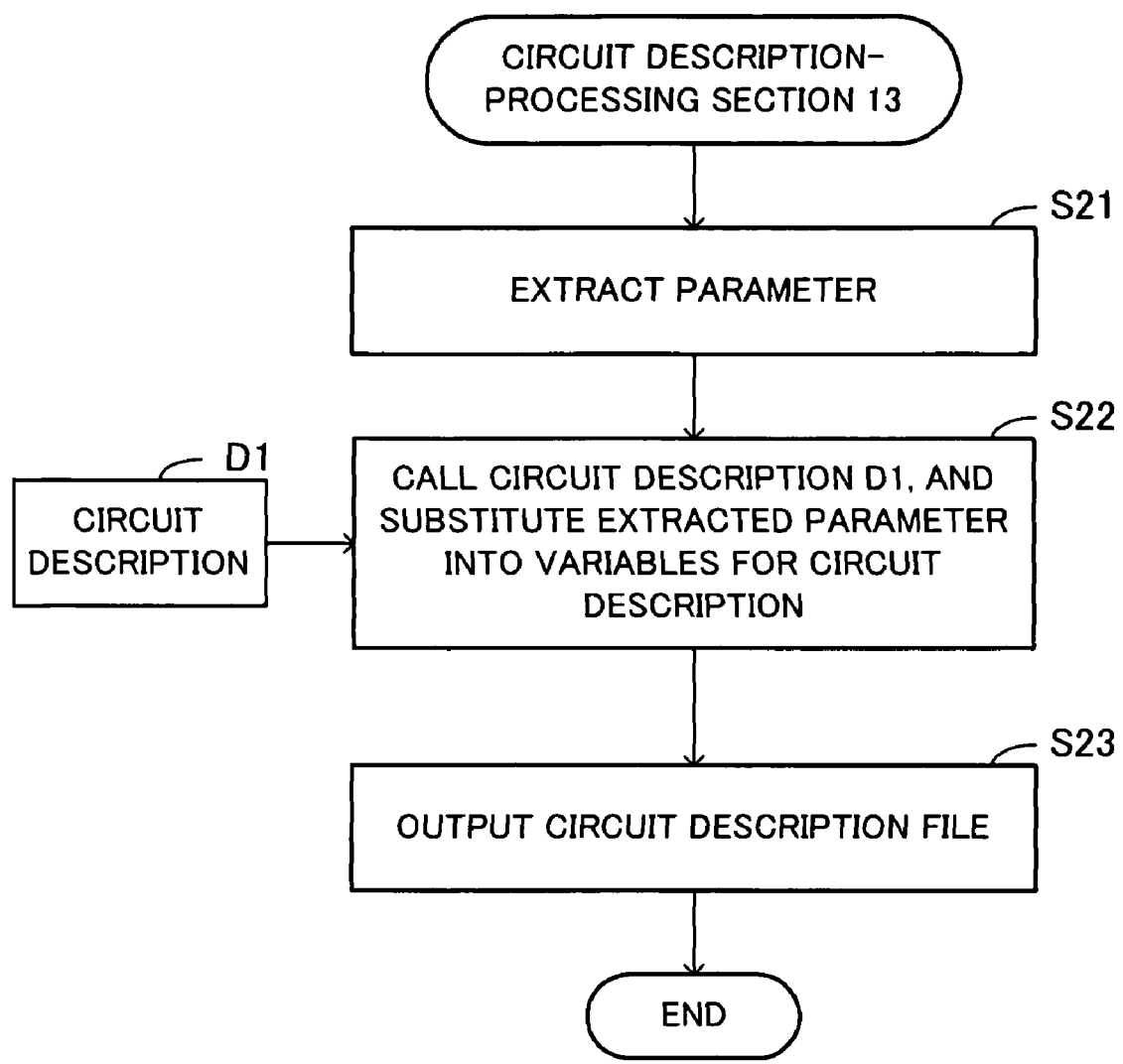
FIG. 22 is a flow diagram showing the operation of a circuit description-processing section.

Next, a description will be given of the operation of the circuit description-processing section 13. FIG. 22 is a flow diagram showing the operation of the circuit description-processing section 13.

[S21] The circuit description-processing section 13 extracts parameters required for constructing a logical memory.

[S22] The circuit description-processing section 13 calls a circuit description D1 that is prepared in advance as data and transformed into variables, and substitutes the extracted parameters into the variables to thereby perform circuit description.

[S23] The circuit description-processing section 13 outputs the circuit description D1 as a circuit description file that realizes a logical memory space, and completes the process.

Figure 23:
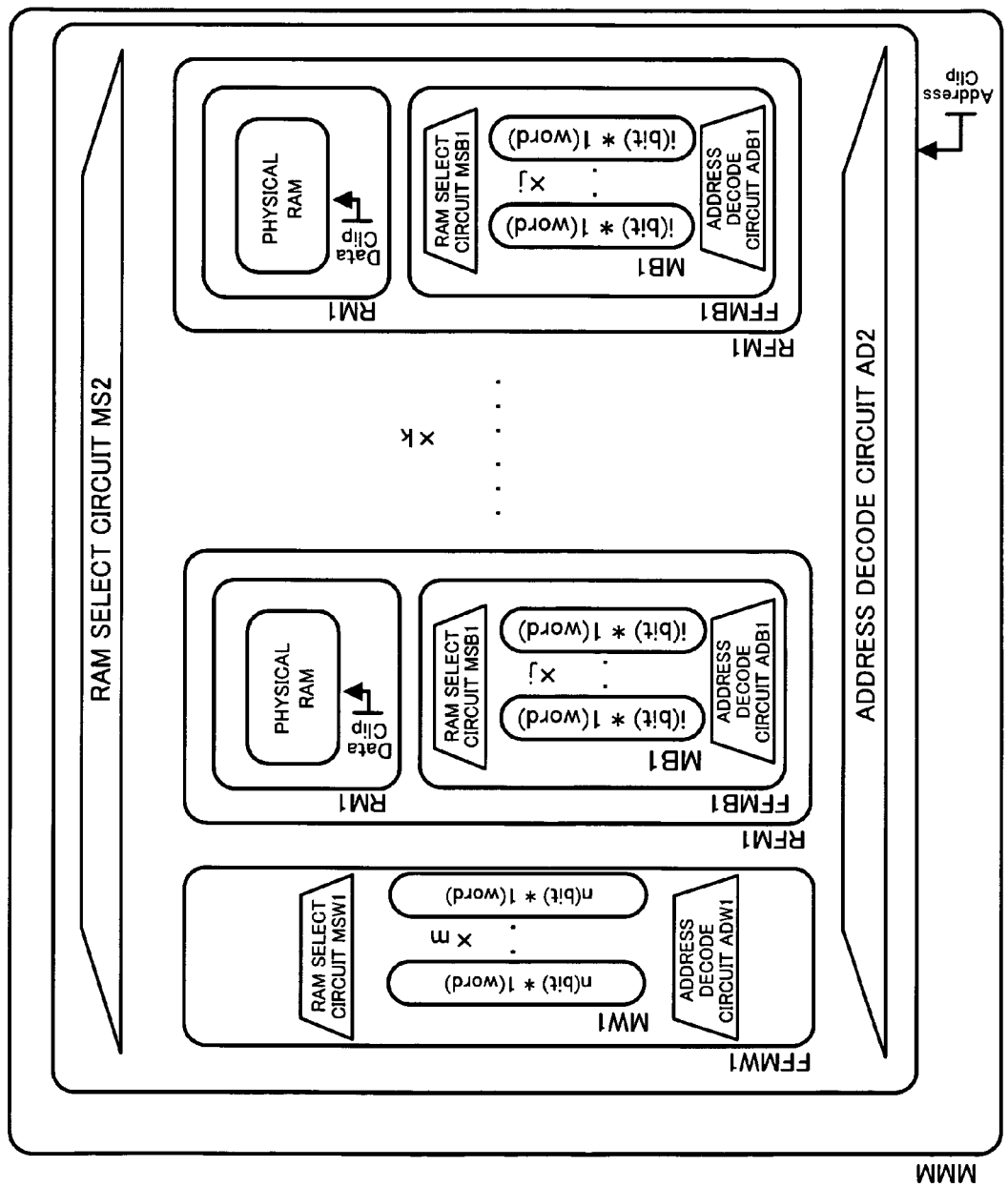
FIG. 23 is a diagram showing an example of circuit configuration generated by circuit description transformed into variables.

FIG. 23 is a diagram showing an example of a circuit configuration generated by the circuit description D1 transformed into variables. FFMW1 represents a word-complementing FF RAM circuit with the FFs of n (bits)*m (words), which is comprised of m 1-word FF RAM circuits MW1 each of which is formed by the FFs of n (bits)*1 (word), an address decode circuit ADW1, and an MW1 FF RAM select circuit MSW1, combined with each other.

RFM1 represents a memory circuit comprised of a bit-complementing FF RAM circuit FFMB1 and a physical RAM RM1. The bit-complementing FF RAM circuit FFMB1 with the FFs of i (bits)*j (words) is comprised of j 1-word FF RAM circuits MB1 each formed by the FFs of i (bits)*1 (word), an address decode circuit ADB1, and an MB1 FF RAM select circuit MSB1.

The physical RAM RM1 has a size defined by a library, and hence sometimes has extra data bits. Therefore, the RFM1 has a data clip variable circuit.

MMM represents a logical memory circuit that is formed by a combination of the word-complementing FF RAM circuit FFMW1, k memory circuits RFM1, an address decode circuit AD2, and a RAM select circuit MS2, such that a memory space of n (bits)×{m+j*k} (words) is formed. Since the logical memory circuit MMM sometimes has an extra address space due to the use of physical RAMs RM1 each having a size defined by the library, it has an address clip variable circuit.

Now, a circuit description file for realizing a logical memory space is formed by extracting and finalizing circuit configuration information on a logical memory, sequentially called from the optimum logical memory construction combination list table T8, as parameter values, and substituting the parameter values into the circuit description D1 transformed into variables.

Figure 26:
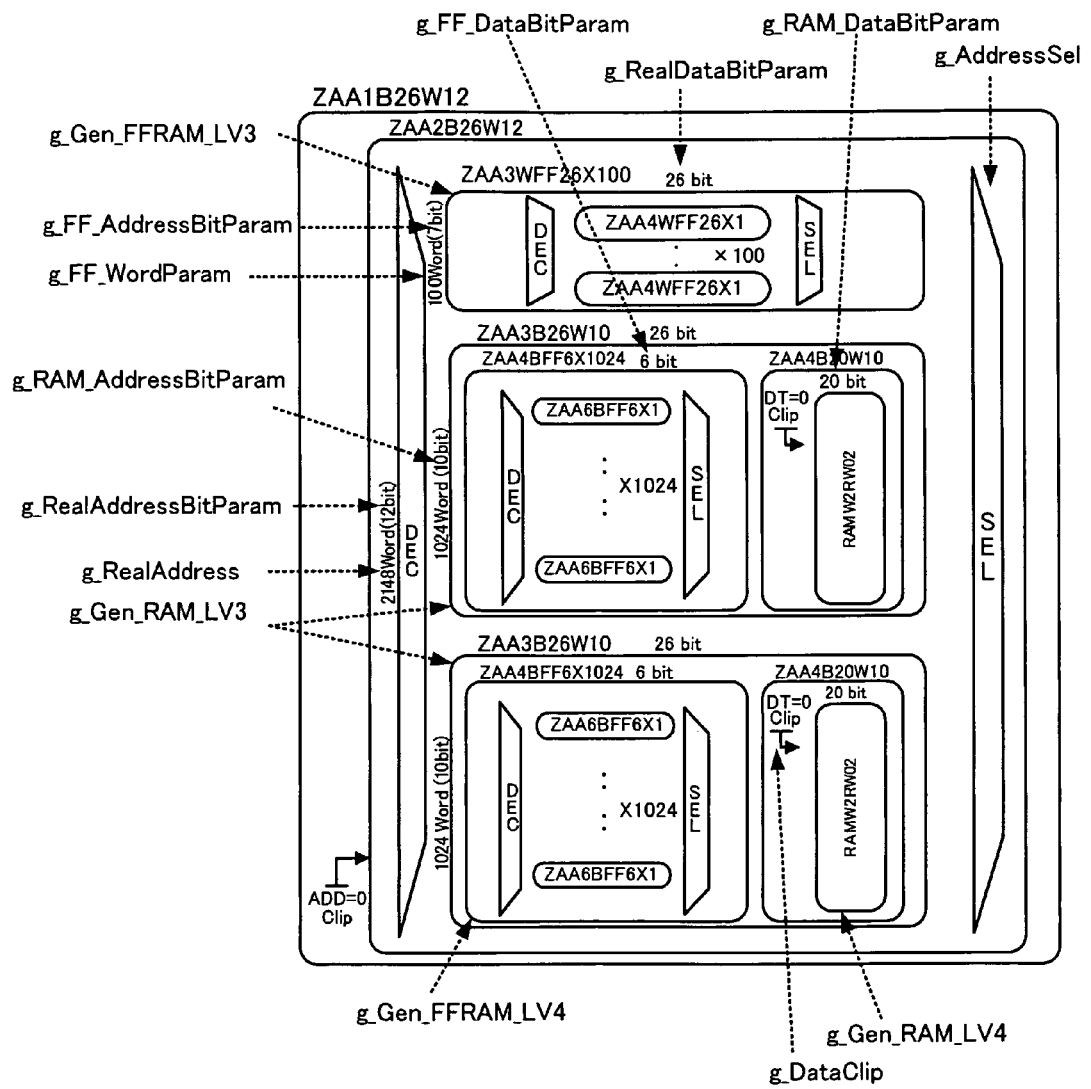
FIG. 26 is a diagram showing locations for setting the parameters.

FIG. 24 is a diagram showing examples of parameters, and FIG. 25 is a diagram showing examples of values of the parameters. Further, FIG. 26 is a diagram showing locations for setting the parameters. It should be noted that FIG. 25 shows values corresponding to parameters extracted from the circuit configuration information associated with the logical condition 1 in the optimum logical memory construction combination list table T8. Hereafter, the names and explanations of parameters, and examples of set values thereof are shown in the following (a) to (o).

(a) g_RealAddress: address length of a logical memory space 1025 is set as the address length since Item number 3 is associated with the logical condition 1 of 42 bits×1025 words.

(b) g_RealAddressBitParam: exponent of a power of 2 for expressing g_RealAddress 11 is set since $2^{10}<1025<2^{11}$ holds.

(c) g_RealDataBitParam: data bit number of the logical memory space 42 is set as the data bit number since the logical condition 1 is defined as 42 bits×1025 words.

(d) g_FF_WordParam: number of words of the word-complementing FF RAM 1 is set from 1 word in the corresponding box of the number of word-complementing FFs in the optimum logical memory construction combination list table T8 in FIG. 18.

(e) g_RAM_AddressBitParam: exponent of a power of 2 for expressing the number of words of the physical RAM.

10 is set since the number of words=1024 in the optimum logical memory construction combination list table TB is equal to $2^{10}$.

(f) g_FF_AddressBitParam: exponent of a power of 2 for expressing g_FF_WordParam.

In the case of 1 word, 1 is set. Since 1 word is written in the corresponding box of the number of word-complementing FFs in the optimum logical memory construction combination list table T8 in FIG. 18, 1 is set.

(g) g_Gen_RAM_LV3: number of physical RAMs in the word direction 1 is set from the number of physical RAMs in the word direction=1 in the optimum logical memory construction combination list table T8 in FIG. 18.

(h) g_Gen_FFRAM_LV3: 1 when there is word-complementing FF RAM 1 is set since there are word-complementing FFs in the optimum logical memory construction combination list table T8 in FIG. 18.

(i) g_AddressSel: exponent of a power of 2 for expressing g_Gen_RAM_LV3+g_Gen_FFRAM_LV3

1 is set since $1+1=2=2^1$.

(j) g_RAM_DataBitParam: number of bits of the physical RAM 20 is set from the number of bits=20 in the optimum logical memory construction combination list table T8 in FIG. 18.

(k) g_FF_DataBitParam: number of bits of the bit-complementing FF RAM 2 is set from the number of bits=2 in the corresponding box of the number of bit-complementing FFs in the optimum logical memory construction combination list table TB in FIG. 18.

(l) g_Gen_RAM_LV4: number of physical RAMs in the bit direction 2 is set from the number of physical RAMs in the bit direction=2 in the optimum logical memory construction combination list table T8 in FIG. 18.

(m) g_Gen_FFRAM LV4: 1 when there are bit-complementing FFs.

1 is set since there are bit-complementing FFs in the optimum logical memory construction combination list table T8 in FIG. 18.

(n) g_AddressClip: (number of bits of physical RAM addresses)−(number of data bits of logical memory space) However, when the resulting value is less than 0, 0 is set.

0 is set since the number of bits of the physical RAM addresses=10, and the number of data bits of the logical memory space=11.

(o) g_DataClip: (number of bits of physical RAM)−(number of bits of logical memory) However, when the resulting value is less than 0, 0 is set.

0 is set since the number of bits of the physical RAM=20, and the number of bits of the logical memory=42.

Figure 27:
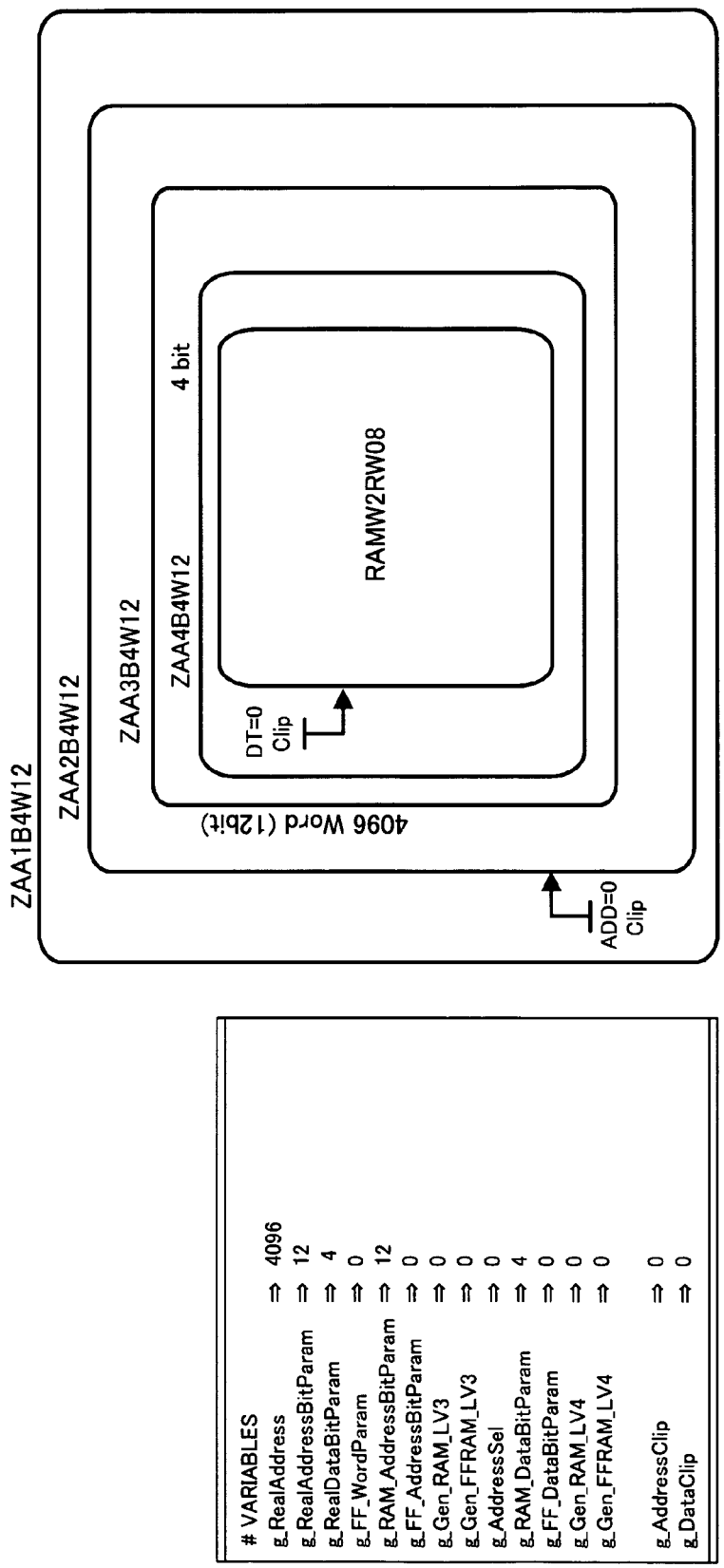
FIG. 27 is a diagram showing an example of the arrangement of a logical memory comprised of a single physical RAM.

Next, a description will be given of examples of the arrangements of logical memories. FIG. 27 is a diagram showing an example of the arrangement of a logical memory comprised of a single physical RAM defined by data of 4 bits and addresses of 4096 words. It should be noted that Add Clip represents address clip having the function of fixing extra address bits to 0, and DT Clip represents the function of fixing data to "0" or "1".

Figure 28:
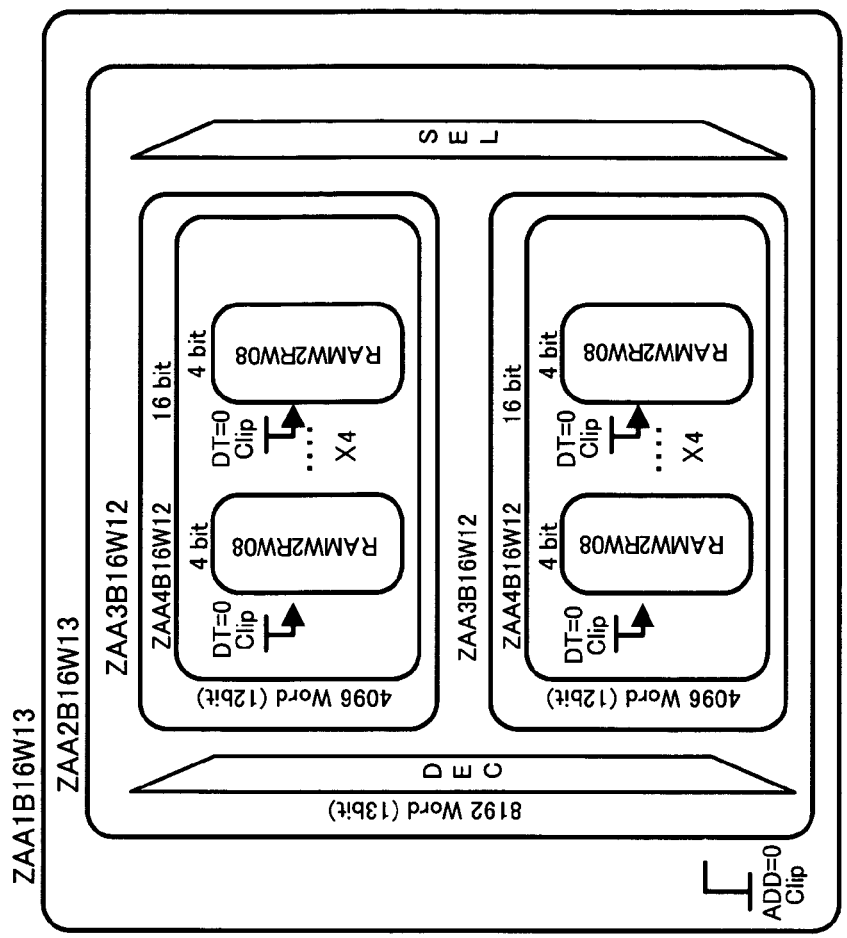
FIG. 28 is a diagram showing an example of the arrangement of a logical memory comprised of a plurality of physical RAMs.

FIG. 28 is a diagram showing an example of the arrangement of a logical memory comprised of a plurality of physical RAMs. The logical memory is defined by data of 16 bits and addresses of 8192 words, and is comprised of physical RAMs (ZAA4B16W12). It should be noted that DEC represents a decoder that decodes an address input to a RAM block, and SEL represents a selector that selects data output from the RAM block according to the address.

FIG. 29 is a diagram showing an example of the arrangement of a logical memory comprised of physical RAMs, bit-complementing FFs, and word-complementing FFs. More specifically, the logical memory is defined by data of 26 bits and addresses of 2148 words, and is comprised of physical RAMs (ZAA4B20W10), bit-complementing FFs (ZAA4BFF6X1024), and word-complementing FFs (ZAA3WFF26X100).

FIG. 30 is a diagram showing an example of the arrangement of a logical memory comprised of physical RAMs, and word-complementing FFs. More specifically, the logical memory is defined by data of 20 bits and addresses of 2304 words, and is comprised of physical RAMs (ZAA4B20W10) and word-complementing FFs (ZAA3WFF20X256).

Figure 31:
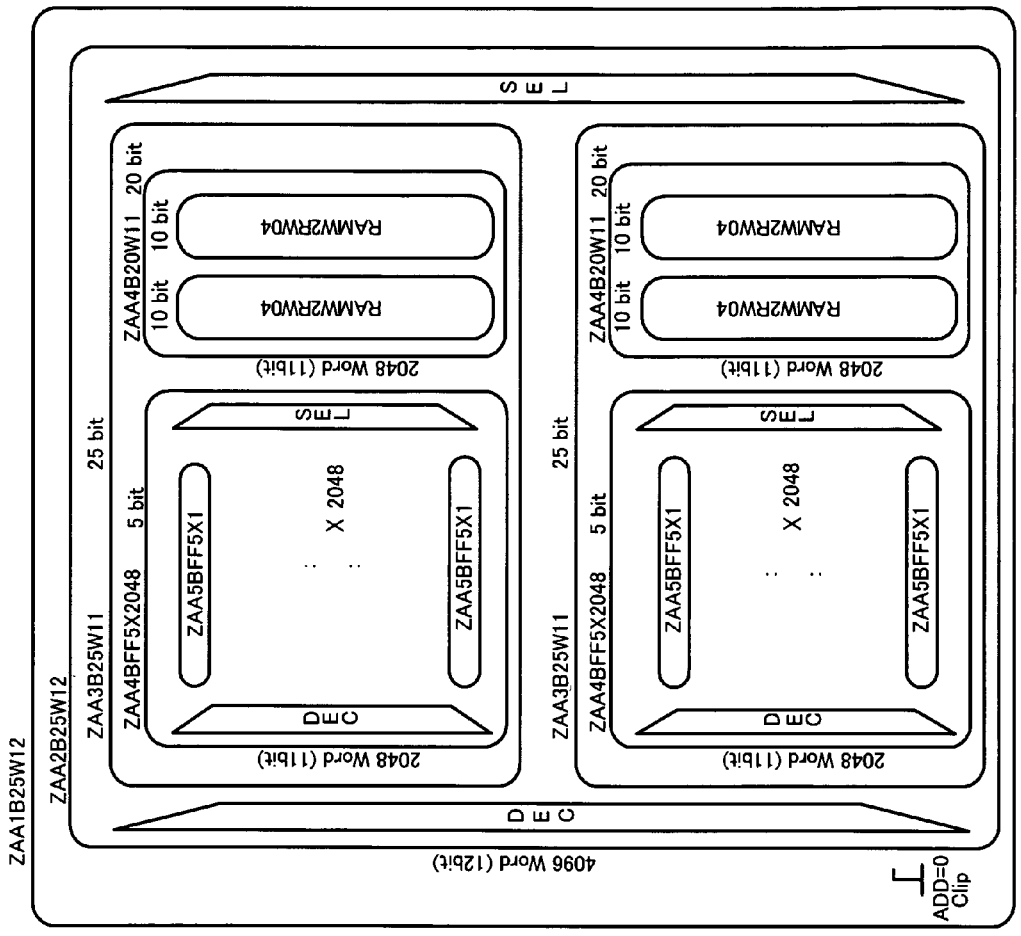
FIG. 31 is a diagram showing an example of the arrangement of a logical memory comprised of physical RAMs, and bit-complementing FFs.

FIG. 31 is a diagram showing an example of the arrangement of a logical memory comprised of physical RAMs, and bit-complementing FFs. More specifically, the logical memory is defined by data of 25 bits and address of 4096 words, and is comprised of physical RAMs (ZAA4B20W11) and bit-complementing FFs (ZAA4BFF5X2048).

Figure 32:
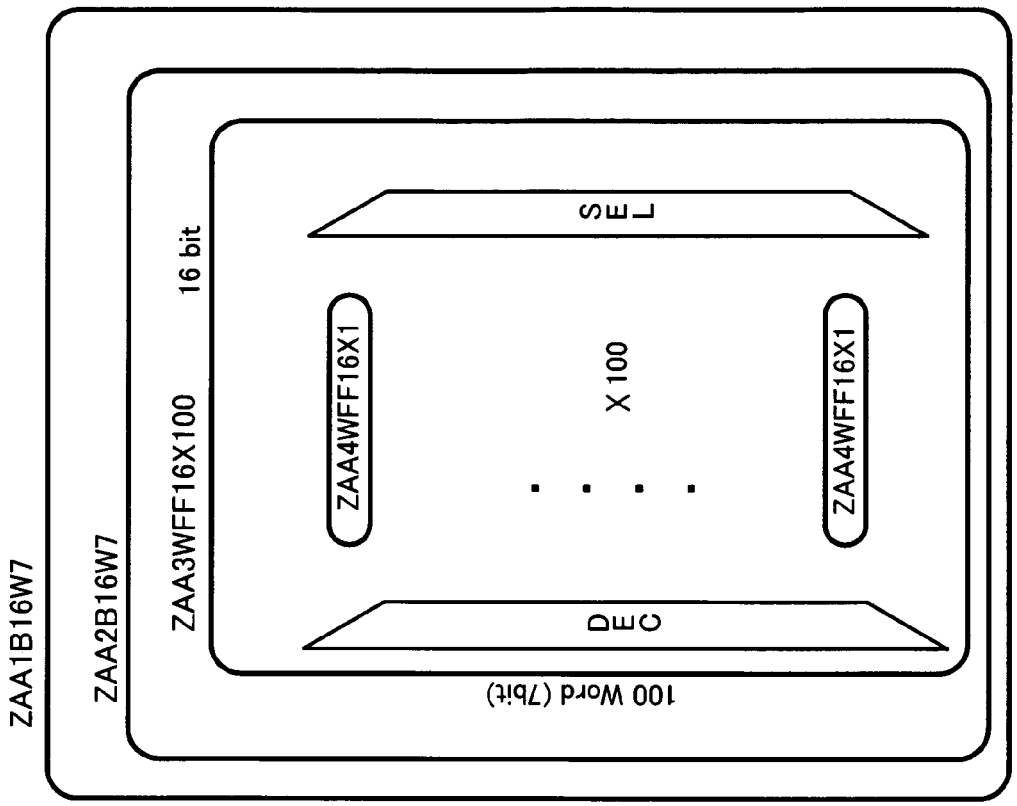
FIG. 32 is a diagram showing an example of the arrangement of a logical memory formed of word-complementing FFs alone.

FIG. 32 is a diagram showing an example of the arrangement of a logical memory comprised of word-complementing FFs alone. The word-complementing FF (ZAA3WFF16X100) has data of 16 bits and addresses of 100 words.

As described above, when FFs are employed to construct logical memories, the logical memories are not only constructed by memory spaces formed by the FFs but also by address decode circuits and memory space select circuits combined with the FFs.

Further, when physical RAMs are employed to construct logical memories, it is assumed that there are constructed logical memories that are formed by physical RAM(s) alone, and logical memories that are formed by combining physical RAMs and complementing FFs (including memory spaces formed by FFs, address decode circuits, and memory space select circuits). It should be noted that the logical memories formed by the physical RAM(s) alone have circuits for clipping extra data, since there sometimes exist extra data bits depending on the sizes of physical RAMs defined in libraries.

As described heretofore, according to the memory construction apparatus 10, optimum logical memories are automatically constructed using physical RAMs and FFs prepared in libraries, such that a desired logical memory space is filled. This makes it unnecessary for a designer to manually combine physical RAMs and FFs or produce new macros, thereby making it possible to enhance conveniences in designing an integrated circuit to shorten TAT.

The memory construction apparatus according to the present invention is configured to perform circuit description by reading several kinds of physical memories and registers prepared in advance as libraries, generating candidates for logical memories by combining only the physical memories or only the registers, or both the physical memories and the registers, with each other, so as to construct logical memories satisfying logical conditions each defining a memory space, selecting highest priority candidates for the logical memories from the candidates according to priorities, and extracting optimum logical memories satisfying the respective logical conditions from the highest priority candidates such that the limits of the numbers of usable physical RAMs and registers are satisfied. This makes it possible to automatically form a desired logical memory space, which makes it possible to design an integrated circuit efficiently.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A memory construction apparatus that constructs logical memories in designing an integrated circuit, comprising:
   a logical memory construction-processing section that reads several kinds of physical memories and registers prepared in advance as libraries, generates respective candidates for each logical memory, by combining only the physical memories or only the registers, or both the physical memories and the registers, so as to construct the logical memory that satisfies a logical condition defining a memory space, and makes a list of the candidates for each individual logical memory, the listed candidates being arranged in increasing order of a total number of physical memories used in the respective candidates;
   an optimum construction extraction-processing section that extracts an optimum construction of logical memories which satisfy a limit number of usable physical memories and a limit number of usable registers, by evaluating each combination of candidates extracted from said lists of the candidates, until a combination satisfying said limit numbers is found; and
   a circuit description-processing section that describes a circuit using the physical memories and the registers to realize the extracted optimum construction of logical memories, and thereby generate a circuit description file,
   wherein when generating the candidates for each logical memory, said logical memory construction-processing section compares a bit number of the logical memory and a bit number of a physical memory, and when the bit number of the logical memory is smaller, said logical memory construction-processing section judges that no division in a bit direction is required, whereas when the bit number of the logical memory is larger, said logical memory construction-processing section divides the bit number of the logical memory by the bit number of the physical memory to thereby calculate a number of divisions in the bit direction and a bit number of registers.

2. The memory construction apparatus according to claim 1, wherein when generating the candidates for each logical memory, said logical memory construction-processing section compares a word number of the logical memory and a word number of a physical memory, and when the word number of the logical memory is smaller, said logical memory construction-processing section judges that no division in a bit direction is required, whereas when the word number of the logical memory is larger, said logical memory construction-processing section divides the word number of the logical memory by the word number of the physical memory to thereby calculate a number of divisions in the word direction and a word number of registers.

3. The memory construction apparatus according to claim 1, further comprising a table storage section that stores logical memory construction combination list tables made on a logical condition-by-logical condition basis, for having written therein information on circuit configuration of each candidate logical memory, a logical memory construction list table for having written therein circuit configuration information on each candidate logical memory corresponding to a no bit-complementing and no word-complementing state as a complementing state of the registers that complement an unfilled memory space, a logical memory candidate list table for having written therein circuit configuration information on each candidate logical memory corresponding to a no bit-complementing and word-complementing state, a bit-complementing and no word-complementing state, or a bit-complementing and word-complementing state, as a complementing state of the registers that complement the unfilled memory space, an optimum logical memory construction combination list table for having written therein circuit configuration information on the optimum logical memories each formed by a combination of the physical memories and the registers.

4. The memory construction apparatus according to claim 3, wherein said logical memory construction-processing section writes, in the logical memory construction combination list tables made on a logical condition-by-logical condition basis, the circuit configuration information on each candidate logical memory, the circuit configuration information comprising items of with-or-without bit complement, with-or-without word complement, a name of physical memories, a number of bits and a number of words of each physical memory, a number of the physical memories as counted in a bit direction, a number of the physical memories as counted in a word direction, a total number of the physical memories, a number of bit-complementing registers, a number of word-complementing registers, and a total number of the registers, and each of the logical memory construction combination list tables contains circuit configuration information on all the candidate logical memories which are capable of satisfying an associated one of the logical conditions.

5. The memory construction apparatus according to claim 4, wherein each logical memory construction combination list table contains the candidate logical memories in a state classified into four groups corresponding to the no bit-complementing and no word-complementing state, the no bit-complementing and word-complementing state, the bit-complementing and no word complementing state, and the bit-complementing and word-complementing state, and wherein said logical memory construction-processing section rearranges, in each group, candidate logical memories from an upper row of the table in an increasing order of the total number of physical memories, candidate logical memories having the same total number of physical memories from an upper row of the table in an increasing order of the number of physical memories in the word direction, and candidate logical memories having the same number of physical memories in the word direction from an upper row of the table in an increasing order of the total number of the registers.

6. The memory construction apparatus according to claim 5, wherein from the logical memory construction combination list tables subjected to the rearrangement, said logical memory construction-processing section extracts the candidate logical memories corresponding to the no bit-complementing and no word-complementing state, on a logical condition-by-logical condition basis, and writes the extracted candidate logical memories in the logical memory construction list table, and extracts the candidate logical memories corresponding to the no bit-complementing and word-complementing state, the bit-complementing and no word-complementing state, and the bit-complementing and word-complementing state, on a logical condition-by-logical condition basis, and writes the extracted candidate logical memories in the logical memory candidate list table.

7. The memory construction apparatus according to claim 6, wherein said logical memory construction-processing section rearranges the candidate logical memories from a top of the logical memory candidate list table in an increasing order of the total number of the registers, and candidate logical memories having the same total number of the registers from an upper row of the table in a decreasing order of the number of the physical memories.

8. The memory construction apparatus according to claim 7, wherein said optimum construction extraction-processing section determines a total sum of physical memories in use from a total number of physical memories of each candidate logical memory associated with a corresponding one of the logical conditions in the logical memory construction list table, compares the total sum of physical memories in use and the limit number of usable physical memories, and when the total sum of logical memories in use is smaller, sets the circuit configuration information written in the logical memory construction list table, as the circuit configuration information on the optimum logical memories, and said circuit description-processing section executes circuit description based on the circuit configuration information on the optimum logical memories, whereas when the total sum of physical memories in use is larger, said optimum construction extraction-processing section extracts the circuit configuration information on the optimum logical memories using the logical memory candidate list table subjected to the rearrangement.

9. The memory construction apparatus according to claim 8, wherein said optimum construction extraction-processing section extracts the circuit configuration information on the optimum logical memories using the logical memory candidate list table subjected to the rearrangement, such that a number of registers in use in each highest priority candidate is smaller than a value of the limit number of usable registers for realizing an associated one of the logical conditions, and at the same time a total number of registers used in all the highest priority candidates is smaller than a value of the limit number of usable registers for realizing a construction of logical memories satisfying the logical conditions, and said circuit description-processing section executes circuit description based on the extracted circuit configuration information.

10. The memory construction apparatus according to claim 1, wherein said logical memory construction-processing section further rearranges the listed candidates having the same number of physical memories, in increasing order of the number of physical memories in a word direction.

11. The memory construction apparatus according to claim 10, wherein said logical memory construction-processing section further rearranges the listed candidates having the same number of physical memories in the word direction, in increasing order of the total number of registers used in the respective candidates.

12. A memory construction apparatus that constructs logical memories in designing an integrated circuit, comprising:
 a logical memory construction-processing section that reads several kinds of physical memories and registers prepared in advance as libraries, generates candidates for each logical memory, by combining only the physical memories or only the registers, or both the physical memories and the registers, so as to construct the logical memory that satisfies a logical condition defining a memory space, and selects highest priority candidates for the logical memories from the candidates according to priorities;
 an optimum construction extraction-processing section that extracts optimum logical memories from the highest priority candidates such that a limit number of usable physical memories and a limit number of usable registers are satisfied;

a circuit description-processing section that describes a circuit using the physical memories and the registers that construct each of the extracted optimum logical memories, to thereby generate a circuit description file; and a table storage section that stores logical memory construction combination list tables made on a logical condition-by-logical condition basis, for having written therein information on circuit configuration of each candidate logical memory, a logical memory construction list table for having written therein circuit configuration information on each candidate logical memory corresponding to a no bit-complementing and no word-complementing state as a complementing state of the registers that complement an unfilled memory space, a logical memory candidate list table for having written therein circuit configuration information on each candidate logical memory corresponding to a no bit-complementing and word-complementing state, a bit-complementing and no word-complementing state, or a bit-complementing and word-complementing state, as a complementing state of the registers that complement the unfilled memory space, an optimum logical memory construction combination list table for having written therein circuit configuration information on the optimum logical memories each formed by a combination of the physical memories and the registers.

13. The memory construction apparatus according to claim 12, wherein said logical memory construction-processing section writes, in the logical memory construction combination list tables made on a logical condition-by-logical condition basis, the circuit configuration information on each candidate logical memory, the circuit configuration information comprising items of with-or-without bit complement, with-or-without word complement, a name of physical memories, a number of bits and a number of words of each physical memory, a number of the physical memories as counted in a bit direction, a number of the physical memories as counted in a word direction, a total number of the physical memories, a number of bit-complementing registers, a number of word-complementing registers, and a total number of the registers, and each of the logical memory construction combination list tables contains circuit configuration information on all the candidate logical memories which are capable of satisfying an associated one of the logical conditions.

14. The memory construction apparatus according to claim 13, wherein each logical memory construction combination list table contains the candidate logical memories in a state classified into four groups corresponding to the no bit-complementing and no word-complementing state, the no bit-complementing and word-complementing state, the bit-complementing and no word complementing state, and the bit-complementing and word-complementing state, and wherein said logical memory construction-processing section rearranges, in each group, candidate logical memories from an upper row of the table in an increasing order of the total number of physical memories, candidate logical memories having the same total number of physical memories from an upper row of the table in an increasing order of the number of physical memories in the word direction, and candidate logical memories having the same number of physical memories in the word direction from an upper row of the table in an increasing order of the total number of the registers.

15. The memory construction apparatus according to claim 14, wherein from the logical memory construction combination list tables subjected to the rearrangement, said logical memory construction-processing section extracts the candidate logical memories corresponding to the no bit-complementing and no word-complementing state, on a logical condition-by-logical condition basis, and writes the extracted candidate logical memories in the logical memory construction list table, and extracts the candidate logical memories corresponding to the no bit-complementing and word-complementing state, the bit-complementing and no word-complementing state, and the bit-complementing and word-complementing state, on a logical condition-by-logical condition basis, and writes the extracted candidate logical memories in the logical memory candidate list table.

16. The memory construction apparatus according to claim 15, wherein said logical memory construction-processing section rearranges the candidate logical memories from a top of the logical memory candidate list table in an increasing order of the total number of the registers, and candidate logical memories having the same total number of the registers from an upper row of the table in a decreasing order of the number of the physical memories.

17. The memory construction apparatus according to claim 16, wherein said optimum construction extraction-processing section determines a total sum of physical memories in use from a total number of physical memories of each candidate logical memory associated with a corresponding one of the logical conditions in the logical memory construction list table, compares the total sum of physical memories in use and the limit number of usable physical memories, and when the total sum of logical memories in use is smaller, sets the circuit configuration information written in the logical memory construction list table, as the circuit configuration information on the optimum logical memories, and said circuit description-processing section executes circuit description based on the circuit configuration information on the optimum logical memories, whereas when the total sum of physical memories in use is larger, said optimum construction extraction-processing section extracts the circuit configuration information on the optimum logical memories using the logical memory candidate list table subjected to the rearrangement.

18. The memory construction apparatus according to claim 17, wherein said optimum construction extraction-processing section extracts the circuit configuration information on the optimum logical memories using the logical memory candidate list table subjected to the rearrangement, such that a number of registers in use in each highest priority candidate is smaller than a value of the limit number of usable registers for realizing an associated one of the logical conditions, and at the same time a total number of registers used in all the highest priority candidates is smaller than a value of the limit number of usable registers for realizing a construction of logical memories satisfying the logical conditions, and said circuit description-processing section executes circuit description based on the extracted circuit configuration information.

* * * * *